United States Patent
Hunt et al.

(10) Patent No.: US 7,434,193 B2
(45) Date of Patent: Oct. 7, 2008

(54) METHOD, SYSTEM AND PROGRAM PRODUCT FOR SPECIFYING A CONFIGURATION FOR A DIGITAL SYSTEM UTILIZING DIAL BIASING WEIGHTS

(75) Inventors: Bryan R. Hunt, Cedar Park, TX (US); Wolfgang Roesner, Austin, TX (US); Robert J. Shadowen, Austin, TX (US); Derek E. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 11/345,847

(22) Filed: Feb. 2, 2006

(65) Prior Publication Data

US 2007/0180423 A1    Aug. 2, 2007

(51) Int. Cl.
*G06F 17/50* (2006.01)
(52) U.S. Cl. .................................. 716/16; 716/18
(58) Field of Classification Search ............ 716/1, 716/16–18
See application file for complete search history.

(56) References Cited

U.S. PATENT DOCUMENTS

| | | | |
|---|---|---|---|
| 5,719,783 A | 2/1998 | Kerzman et al. | |
| 6,216,255 B1 | 4/2001 | Ito et al. | |
| 6,260,177 B1 | 7/2001 | Lee et al. | |
| 6,378,123 B1 | 4/2002 | Dupenloup | |
| 6,466,898 B1 | 10/2002 | Chan | |
| 6,574,787 B1 | 6/2003 | Anderson | |
| 6,588,006 B1 | 7/2003 | Watkins | |
| 6,618,839 B1 | 9/2003 | Beardslee et al. | |
| 6,629,249 B2 | 9/2003 | Gonzalez | |
| 6,823,497 B2 | 11/2004 | Schubert et al. | |
| 6,826,732 B2 | 11/2004 | Hunt et al. | |
| 6,993,729 B2 * | 1/2006 | Nelson et al. | 716/1 |
| 7,096,434 B2 * | 8/2006 | Roesner et al. | 716/1 |
| 7,143,387 B2 * | 11/2006 | Fields et al. | 716/18 |
| 2002/0108092 A1 | 8/2002 | Yasuda | |
| 2003/0182642 A1 | 9/2003 | Schubert et al. | |
| 2004/0216077 A1 | 10/2004 | Roesner et al. | |
| 2004/0216079 A1 | 10/2004 | Hunt et al. | |

* cited by examiner

*Primary Examiner*—Jack Chiang
*Assistant Examiner*—Binh C Tat
(74) *Attorney, Agent, or Firm*—Libby Z. Handelsman; Dillon & Yudell LLP

(57) ABSTRACT

In a method of data processing, a database defines a Dial entity and at least one instance of the Dial entity. Each instance of the Dial entity has an input having a plurality of different possible input values and one or more outputs, and each of the plurality of different possible input values has a different associated output value set for the one or more outputs. Each instance of the Dial entity determines a value of at least one of a plurality of configuration latches in a digital system separate from the database. The database also associates with the Dial entity at least one set of biasing weights that, when applied, determines a probability of each instance of the Dial entity having particular ones of the plurality of different possible input values. In response to a call to set the plurality of configuration latches, the database is accessed to apply the at least one set of biasing weights to select one of the plurality of different possible input values for the at least one instance of the Dial entity. The plurality of configuration latches in the digital system are set based upon the output value set for the one or more outputs of the at least one instance of the Dial entity.

6 Claims, 26 Drawing Sheets

METHOD, SYSTEM AND PROGRAM PRODUCT FOR SPECIFYING A CONFIGURATION FOR A DIGITAL SYSTEM UTILIZING DIAL BIASING WEIGHTS

CROSS-REFERENCE TO RELATED APPLICATION

The present application is related to U.S. patent application Ser. No. 10/750,112, which is assigned to the assignee of the present invention and incorporated herein by reference in its entirety.

BACKGROUND OF THE INVENTION

1. Technical Field

The present invention relates in general to designing, simulating and configuring digital devices, modules and systems, and in particular, to methods and systems for computer-aided design, simulation, and configuration of digital devices, modules and systems described by a hardware description language (HDL) model.

2. Description of the Related Art

In modern data processing systems, especially large server-class computer systems, the number of latches that must be loaded to configure the system for operation (or simulation) is increasing dramatically. One reason for the increase in configuration latches is that many chips are being designed to support multiple different configurations and operating modes in order to improve manufacturer profit margins and simplify system design. For example, memory controllers commonly require substantial configuration information to properly interface memory cards of different types, sizes, and operating frequencies.

A second reason for the increase in configuration latches is the ever-increasing transistor budget within processors and other integrated circuit chips. Often the additional transistors available within the next generation of chips are devoted to replicated copies of existing functional units in order to improve fault tolerance and parallelism. However, because transmission latency via intra-chip wiring is not decreasing proportionally to the increase in the operating frequency of functional logic, it is generally viewed as undesirable to centralize configuration latches for all similar functional units. Consequently, even though all instances of a replicated functional unit are frequently identically configured, each instance tends to be designed with its own copy of the configuration latches. Thus, configuring an operating parameter having only a few valid values (e.g., the ratio between the bus clock frequency and processor clock frequency) may involve setting hundreds of configuration latches in a processor chip.

Conventionally, configuration latches and their permitted range of values have been specified by error-prone paper documentation that is tedious to create and maintain. Compounding the difficulty in maintaining accurate configuration documentation and the effort required to set configuration latches is the fact that different constituencies within a single company (e.g., a functional simulation team, a laboratory debug team, and one or more customer firmware teams) often separately develop configuration software from the configuration documentation. As the configuration software is separately developed by each constituency, each team may introduce its own errors and employ its own terminology and naming conventions. Consequently, the configuration software developed by the different teams is not compatible and cannot easily be shared between the different teams.

In addition to the foregoing shortcomings in the process of developing configuration code, conventional configuration software is extremely tedious to code. In particular, the vocabulary used to document the various configuration bits is often quite cumbersome. For example, in at least some implementations, configuration code must specify, for each configuration latch bit, a full latch name, which may include fifty or more ASCII characters. In addition, valid binary bit patterns for each group of configuration latches must be individually specified. Moreover, handcoding configuration software based upon the error-prone documentation may introduce additional errors in the configuration process.

SUMMARY OF THE INVENTION

Improved methods, systems, and program products for specifying the configuration of a digital system are disclosed. According to one method, a database defines a Dial entity and at least one instance of the Dial entity. Each instance of the Dial entity has an input having a plurality of different possible input values and one or more outputs, and each of the plurality of different possible input values has a different associated output value set for the one or more outputs. Each instance of the Dial entity determines a value of at least one of a plurality of configuration latches in a digital system separate from the database. The database also associates with the Dial entity at least one set of biasing weights that, when applied, determines a probability of each instance of the Dial entity having particular ones of the plurality of different possible input values. In response to a call to set the plurality of configuration latches, the database is accessed to apply the at least one set of biasing weights to select one of the plurality of different possible input values for the at least one instance of the Dial entity. The plurality of configuration latches in the digital system are set based upon the output value set for the one or more outputs of the at least one instance of the Dial entity.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

DETAILED DESCRIPTION OF ILLUSTRATIVE EMBODIMENT

The present invention introduces a configuration specification language and associated methods, systems, and program products for configuring and controlling the setup of a digital system (e.g., one or more integrated circuits or a simulation model thereof). In at least one embodiment, configuration specifications for signals in the digital system are created in HDL code by the designer responsible for an associated design entity. Thus, designers at the front end of the design process, which are best able to specify the signal names and associated legal values, are responsible for creating the configuration specification. The configuration specification is compiled at model build time together with the HDL describing the digital system to obtain a configuration database that can then be utilized by downstream organizational groups involved in the design, simulation, and hardware implementation processes.

Figure 1:
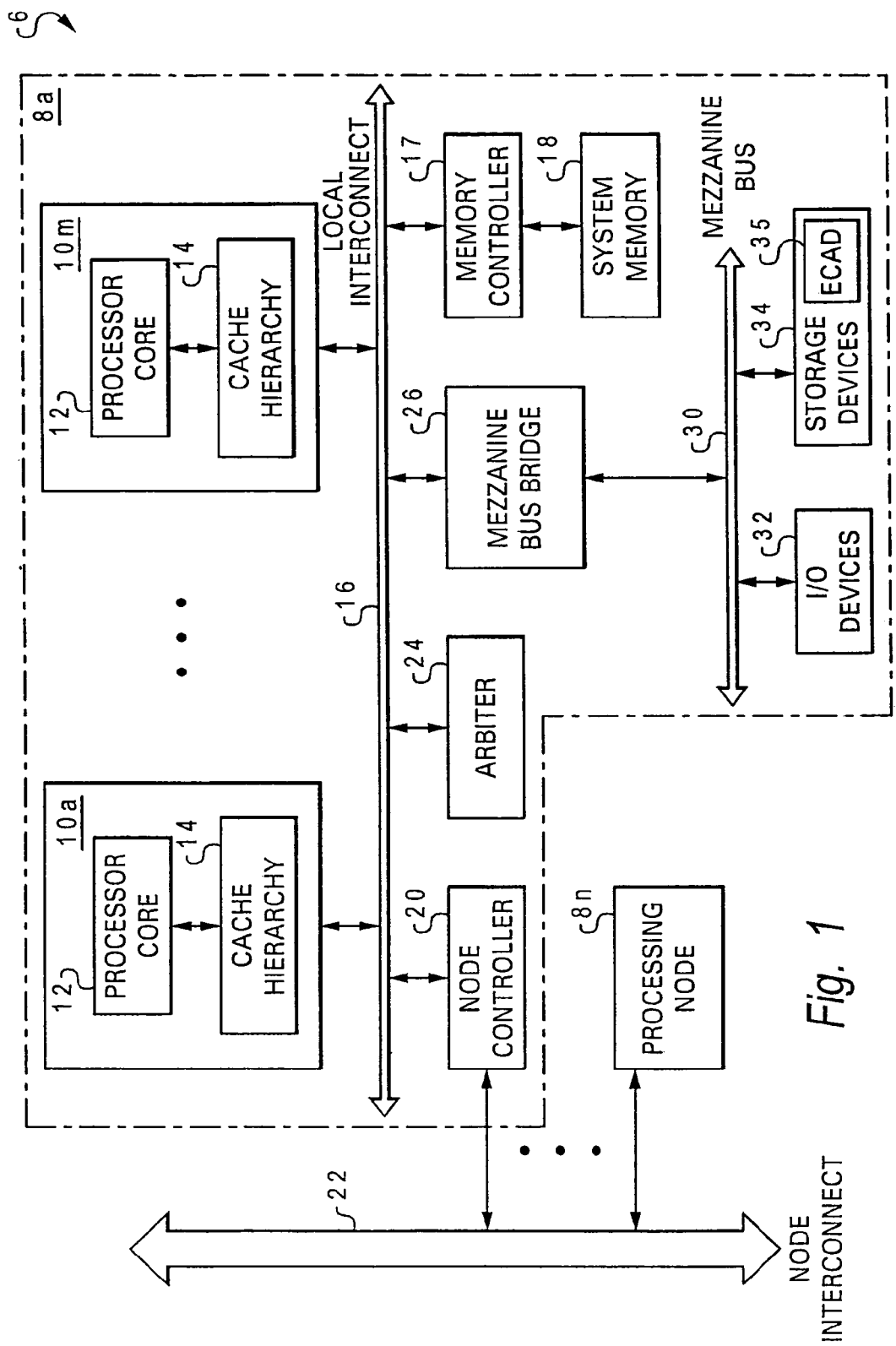
FIG. 1 is a high level block diagram of a data processing system that may be utilized to implement the present invention.

With reference now to the figures, and in particular with reference to FIG. 1, there is depicted an exemplary embodiment of a data processing system in accordance with the present invention. The depicted embodiment can be realized, for example, as a workstation, server, or mainframe computer.

As illustrated, data processing system 6 includes one or more processing nodes 8a-8n, which, if more than one processing node 8 is implemented, are interconnected by node interconnect 22. Processing nodes 8a-8n may each include one or more processors 10, a local interconnect 16, and a system memory 18 that is accessed via a memory controller 17. Processors 10a-10m are preferably (but not necessarily) identical and may comprise a processor within the PowerPC™ line of processors available from International Business Machines (IBM) Corporation of Armonk, N.Y. In addition to the registers, instruction flow logic and execution units utilized to execute program instructions, which are generally designated as processor core 12, each of processors 10a-10m also includes an on-chip cache-hierarchy that is utilized to stage data to the associated processor core 12 from system memories 18.

Each of processing nodes 8a-8n further includes a respective node controller 20 coupled between local interconnect 16 and node interconnect 22. Each node controller 20 serves as a local agent for remote processing nodes 8 by performing at least two functions. First, each node controller 20 snoops the associated local interconnect 16 and facilitates the transmission of local communication transactions to remote processing nodes 8. Second, each node controller 20 snoops communication transactions on node interconnect 22 and masters relevant communication transactions on the associated local interconnect 16. Communication on each local interconnect 16 is controlled by an arbiter 24. Arbiters 24 regulate access to local interconnects 16 based on bus request signals generated by processors 10 and compile coherency responses for snooped communication transactions on local interconnects 16.

Local interconnect 16 is coupled, via mezzanine bus bridge 26, to a mezzanine bus 30. Mezzanine bus bridge 26 provides both a low latency path through which processors 10 may directly access devices among I/O devices 32 and storage devices 34 that are mapped to bus memory and/or I/O address spaces and a high bandwidth path through which I/O devices 32 and storage devices 34 may access system memory 18. I/O devices 32 may include, for example, a display device, a keyboard, a graphical pointer, and serial and parallel ports for connection to external networks or attached devices. Storage devices 34 may include, for example, optical or magnetic disks that provide non-volatile storage for operating system, middleware and application software. In the present embodiment, such application software includes an ECAD system 35, which can be utilized to develop, verify and simulate a digital circuit design in accordance with the methods and systems of the present invention.

Figure 2:
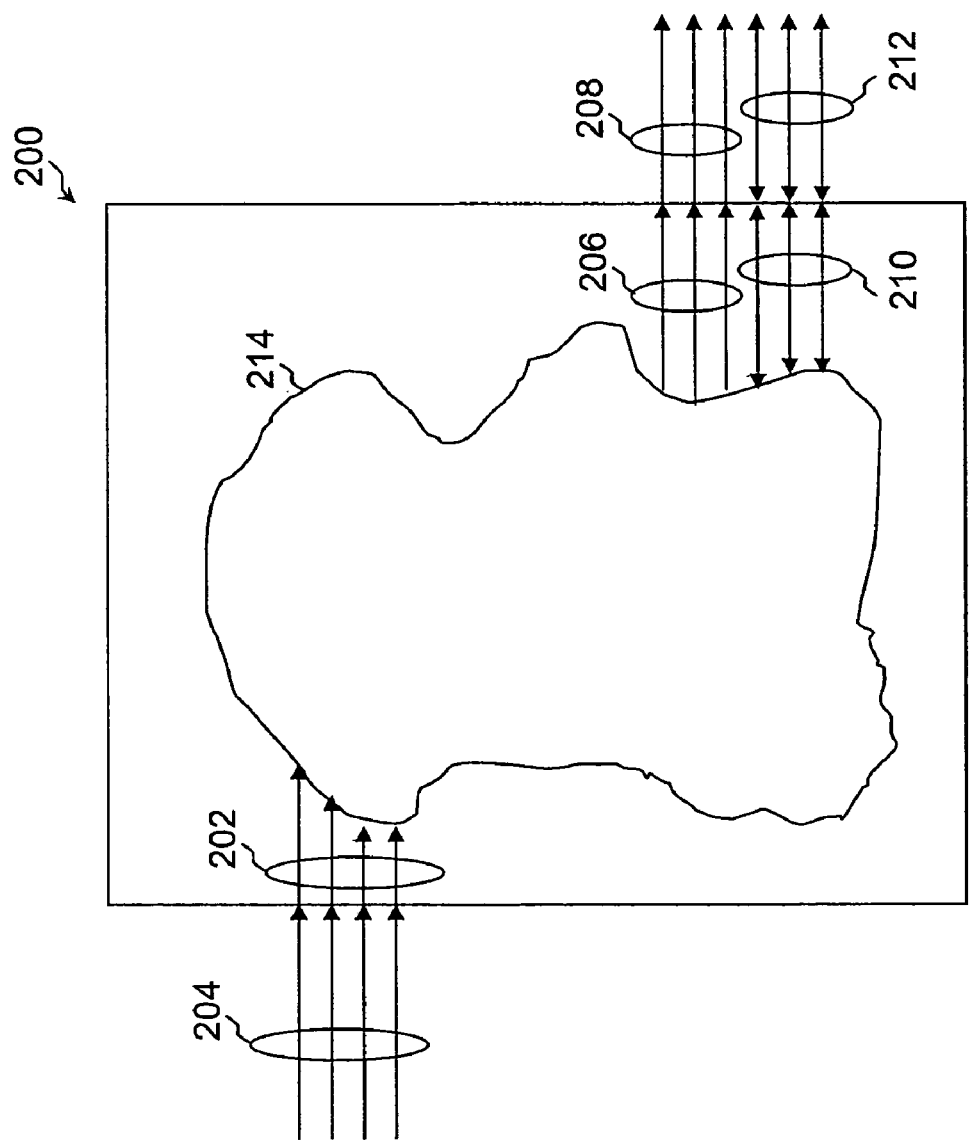
FIG. 2 is a diagrammatic representation of a design entity described by HDL code.

Simulated digital circuit design models created utilizing ECAD system 35 are comprised of at least one, and usually many, sub-units referred to hereinafter as design entities. Referring now to FIG. 2, there is illustrated a block diagram representation of an exemplary design entity 200 which may be created utilizing ECAD system 35. Design entity 200 is defined by a number of components: an entity name, entity ports, and a representation of the function performed by design entity 200. Each design entity within a given model has a unique entity name (not explicitly shown in FIG. 2) that is declared in the HDL description of the design entity. Furthermore, each design entity typically contains a number of signal interconnections, known as ports, to signals outside the design entity. These outside signals may be primary input/outputs (I/Os) of an overall design or signals connected to other design entities within an overall design.

Typically, ports are categorized as belonging to one of three distinct types: input ports, output ports, and bi-directional ports. Design entity 200 is depicted as having a number of input ports 202 that convey signals into design entity 200. Input ports 202 are connected to input signals 204. In addition, design entity 200 includes a number of output ports 206 that convey signals out of design entity 200. Output ports 206 are connected to a set of output signals 208. Bi-directional ports 210 are utilized to convey signals into and out of design entity 200. Bi-directional ports 210 are in turn connected to a set of bi-directional signals 212. A design entity, such as design entity 200, need not contain ports of all three types, and in the degenerate case, contains no ports at all. To accomplish the connection of entity ports to external signals, a mapping technique, known as a "port map", is utilized. A port map (not explicitly depicted in FIG. 2) consists of a specified correspondence between entity port names and external signals to which the entity is connected. When building a simulation model, ECAD software 35 is utilized to connect external signals to appropriate ports of the entity according to a port map specification.

As further illustrated in FIG. 2, design entity 200 contains a body section 214 that describes one or more functions performed by design entity 200. In the case of a digital design, body section 214 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Each design entity is specified by one or more HDL files that contain the information necessary to describe the design entity. Although not required by the present invention, it will hereafter be assumed for ease of understanding that each design entity is specified by a respective HDL file.

Figure 3:
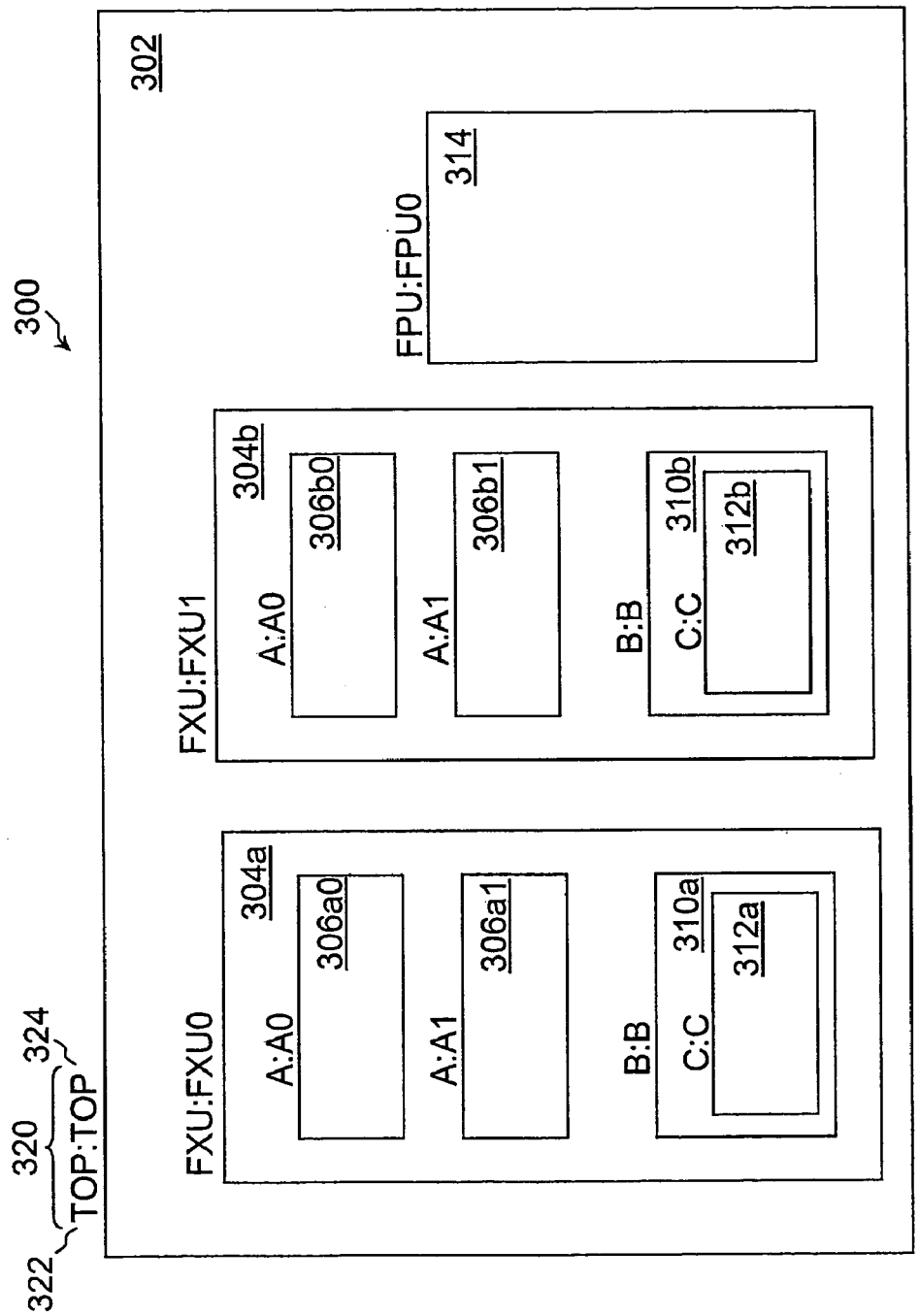
FIG. 3 illustrates an exemplary digital design including a plurality of hierarchically arranged design entities.

With reference now to FIG. 3, there is illustrated a diagrammatic representation of an exemplary simulation model 300 that may be employed by ECAD system 35 to represent a digital design (e.g., an integrated circuit chip or a computer system) in a preferred embodiment of the present invention. For visual simplicity and clarity, the ports and signals interconnecting the design entities within simulation model 300 have not been explicitly shown.

Simulation model 300 includes a number of hierarchically arranged design entities. As within any simulation model, simulation model 300 includes one and only one "top-level entity" encompassing all other entities within simulation model 300. That is to say, top-level entity 302 instantiates, either directly or indirectly, all descendant entities within the digital design. Specifically, top-level entity 302 directly instantiates (i.e., is the direct ancestor of) two instances, 304a and 304b, of the same FiXed-point execution Unit (FXU) entity 304 and a single instance of a Floating Point Unit (FPU) entity 314. FXU entity instances 304, having instantiation names FXU0 and FXU1, respectively, in turn instantiate additional design entities, including multiple instantiations of entity A 306 having instantiation names A0 and A1, respectively.

Each instantiation of a design entity has an associated description that contains an entity name and an instantiation name, which must be unique among all descendants of the direct ancestor entity, if any. For example, top-level entity 302 has a description 320 including an entity name 322 (i.e., the "TOP" preceding the colon) and also includes an instantiation name 324 (i.e., the "TOP" following the colon). Within an entity description, it is common for the entity name to match the instantiation name when only one instance of that particular entity is instantiated within the ancestor entity. For example, single instances of entity B 310 and entity C 312 instantiated within each of FXU entity instantiations 304a and 304b have matching entity and instantiation names. However, this naming convention is not required by the present invention as shown by FPU entity 314 (i.e., the instantiation name is FPU0, while the entity name is FPU).

The nesting of entities within other entities in a digital design can continue to an arbitrary level of complexity, provided that all entities instantiated, whether singly or multiply, have unique entity names and the instantiation names of all descendant entities within any direct ancestor entity are unique with respect to one another.

Associated with each design entity instantiation is a so called "instantiation identifier". The instantiation identifier for a given instantiation is a string including the enclosing entity instantiation names proceeding from the top-level entity instantiation name. For example, the design instantiation identifier of instantiation 312a of entity C 312 within instantiation 304a of FXU entity 304 is "TOP.FXU0.B.C". This instantiation identifier serves to uniquely identify each instantiation within a simulation model.

As discussed above, a digital design, whether realized utilizing physical integrated circuitry or as a software model such as simulation model 300, typically includes configuration latches utilized to configure the digital design for proper operation. In contrast to prior art design methodologies, which employ stand-alone configuration software created after a design is realized to load values into the configuration latches, the present invention introduces a configuration specification language that permits a digital designer to specify configuration values for signals as a natural part of the design process. In particular, the configuration specification language of the present invention permits a design configuration to be specified utilizing statements either embedded in one or more HDL files specifying the digital design (as illustrated in FIG. 4A) or in one or more external configuration files referenced by the one or more HDL files specifying the digital design (as depicted in FIG. 4B).

Figure 4A:
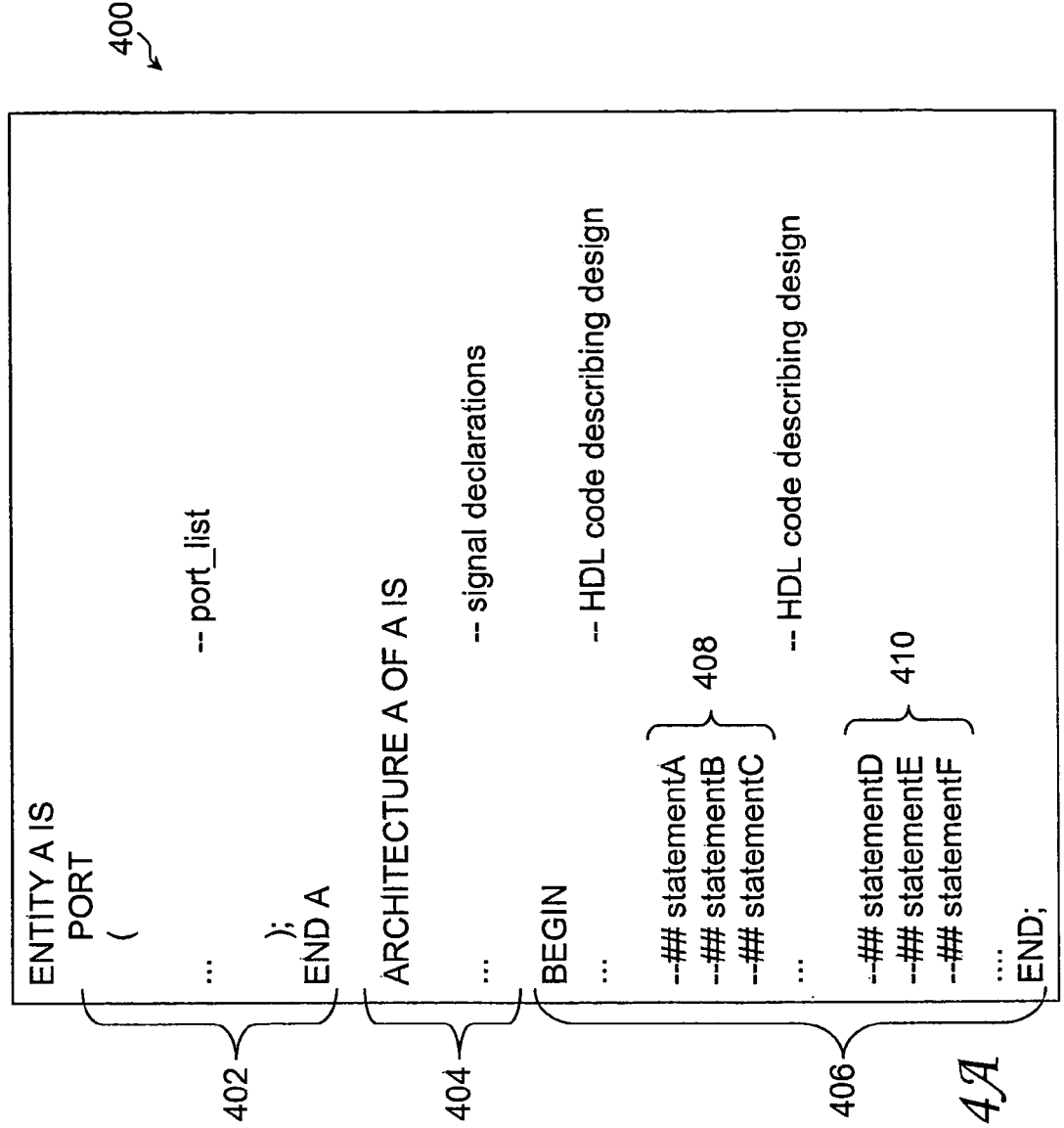
FIG. 4A depicts an exemplary HDL file including embedded configuration specification statements in accordance with the present invention.

Referring now to FIG. 4A, there is depicted an exemplary HDL file 400, in this case a VHDL file, including embedded configuration statements in accordance with the present invention. In this example, HDL file 400 specifies entity A 306 of simulation model 300 and includes three sections of VHDL code, namely, a port list 402 that specifies ports 202, 206 and 210, signal declarations 404 that specify the signals within body section 214, and a design specification 406 that specifies the logic and functionality of body section 214. Interspersed within these sections are conventional VHDL comments denoted by an initial double-dash ("--"). In addition, embedded within design specification 406 are one or more configuration specification statements in accordance with the present invention, which are collectively denoted by reference numerals 408 and 410. As shown, these configuration specification statements are written in a special comment form beginning with "--##" in order to permit a compiler to easily distinguish the configuration specification statements from the conventional HDL code and HDL comments. Configuration specification statements preferably employ a syntax that is insensitive to case and white space.

Figure 4B:
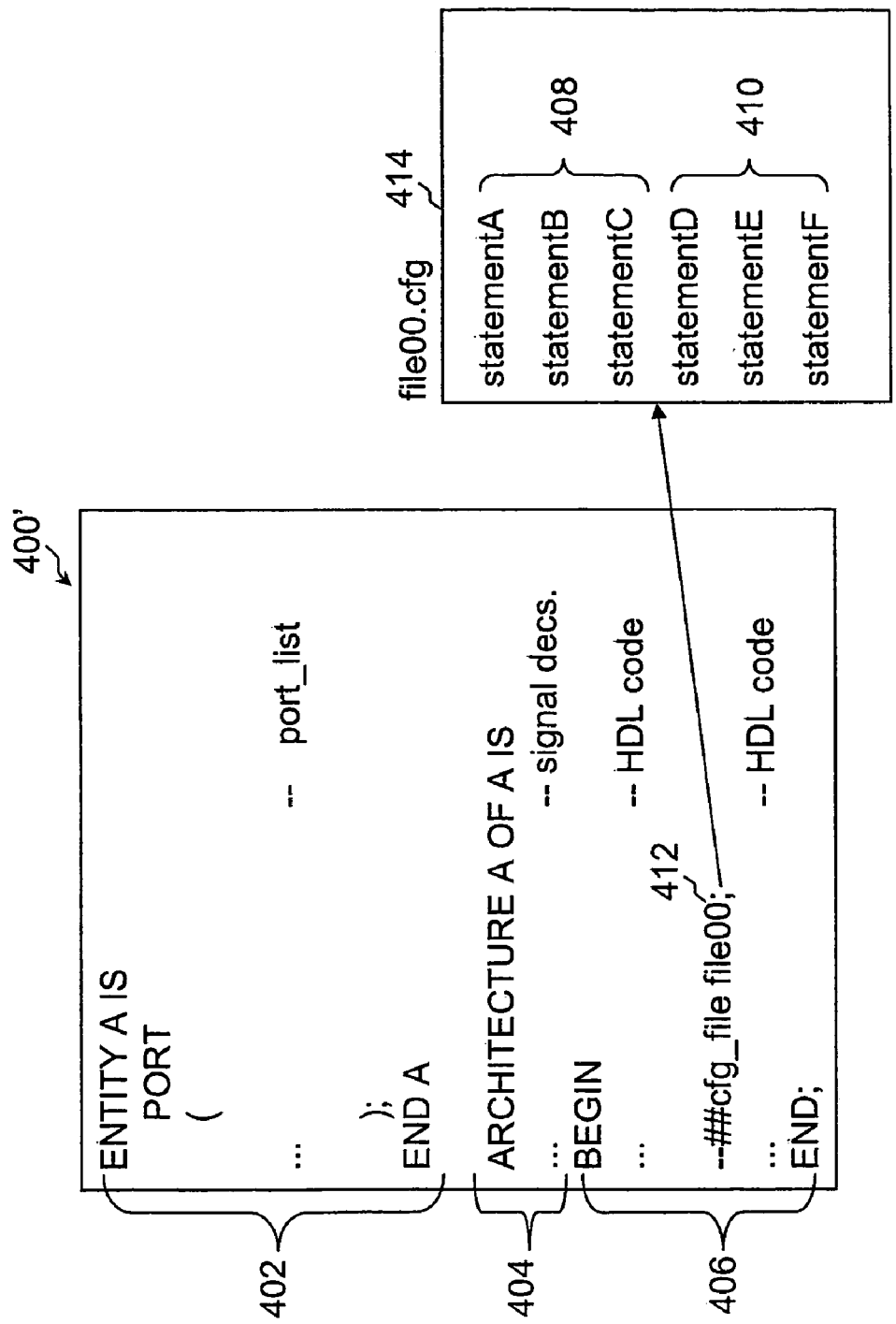
FIG. 4B illustrates an exemplary HDL file including an embedded configuration file reference statement referring to an external configuration file containing a configuration specification statement in accordance with the present invention.

With reference now to FIG. 4B, there is illustrated an exemplary HDL file 400' that includes a reference to an external configuration file containing one or more configuration specification statements in accordance with the present invention. As indicated by prime notation ('), HDL file 400' is identical to HDL file 400 in all respects except that configuration specification statements 408, 410 are replaced with one or more (and in this case only one) configuration file reference statement 412 referencing a separate configuration file 414 containing configuration specification statements 408, 410.

Configuration file reference statement 412, like the embedded configuration specification statements illustrated in FIG. 4A, is identified as a configuration statement by the identifier "--##". Configuration file reference statement 412 includes the directive "cfg_file", which instructs the compiler to locate a separate configuration file 414, and the filename of the configuration file (i.e., "file00"). Configuration files, such as configuration file 412, preferably all employ a selected filename extension (e.g., ".cfg") so that they can be easily located, organized, and managed within the file system employed by data processing system 6.

As discussed further below with reference to FIG. 8, configuration specification statements, whether embedded within an HDL file or collected in one or more configuration files 414, are processed by a compiler together with the associated HDL files.

In accordance with a preferred embodiment of the present invention, configuration specification statements, such as configuration specification statements 408, 410, facilitate configuration of configuration latches within a digital design by instantiating one or more instances of a configuration entity referred to herein generically as a "Dial." A Dial's function is to map between an input value and one or more output values. In general, such output values ultimately directly or indirectly specify configuration values of configuration latches. Each Dial is associated with a particular design entity in the digital design, which by convention is the design entity specified by the HDL source file containing the configuration specification statement or configuration file reference statement that causes the Dial to be instantiated. Consequently, by virtue of their association with particular design entities, which all have unique instantiation identifiers, Dials within a digital design can be uniquely identified as long as unique Dial names are employed within any given design entity. As will become apparent, many different types of Dials can be defined, beginning with a Latch Dial (or "LDial").

Figure 5A:
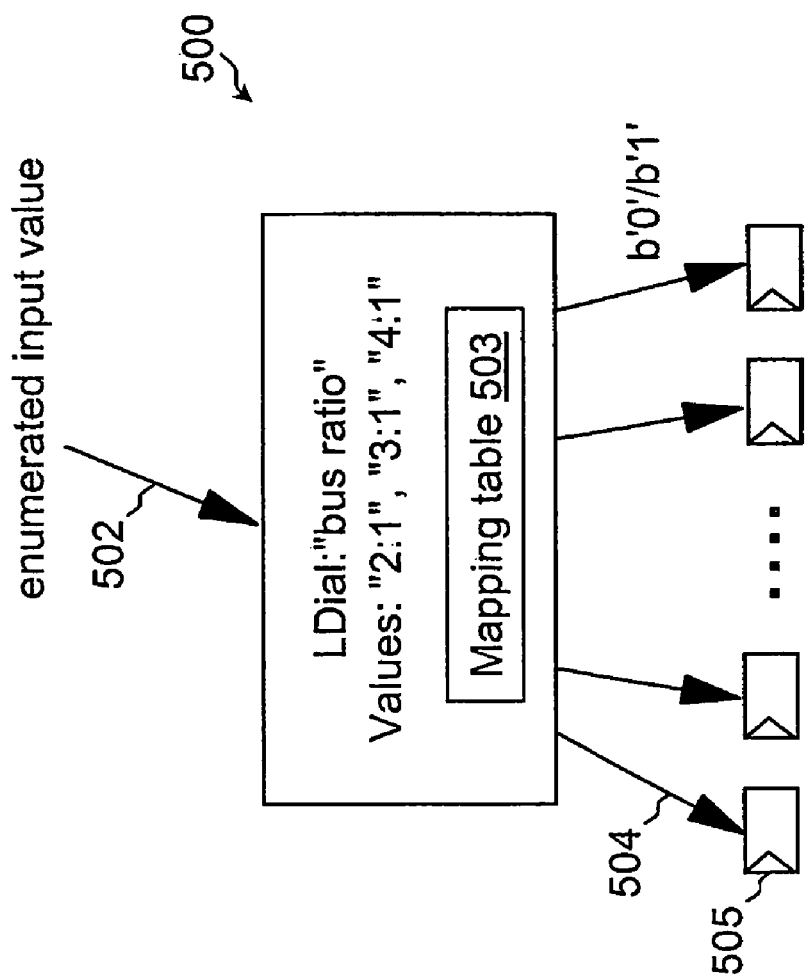
FIG. 5A is a diagrammatic representation of an LDial primitive in accordance with the present invention

Referring now to FIG. 5A, there is depicted a representation of an exemplary LDial 500. In this particular example, LDial 500, which has the name "bus ratio", is utilized to specify values for configuration latches in a digital design in accordance with an enumerated input value representing a selected ratio between a component clock frequency and bus clock frequency.

As illustrated, LDial 500, like all Dials, logically has a single input 502, one or more outputs 504, and a mapping table 503 that maps each input value to a respective associated output value for each output 504. That is, mapping table 503 specifies a one-to-one mapping between each of one or more unique input values and a respective associated unique output value. Because the function of an LDial is to specify the legal values of configuration latches, each output 504 of LDial 500 logically controls the value loaded into a respective configuration latch 505. To prevent conflicting configurations, each configuration latch 505 is directly specified by one and only one Dial of any type that is capable of setting the configuration latch 505.

At input 502, LDial 500 receives an enumerated input value (i.e., a string) among a set of legal values including "2:1", "3:1" and "4:1". The enumerated input value can be provided directly by software (e.g., by a software simulator or service processor firmware) or can be provided by the output of another Dial, as discussed further below with respect to FIG. 7A. For each enumerated input value, the mapping table 503 of LDial 500 indicates a selected binary value (i.e., "0" or "1") for each configuration latch 505.

Figure 5B:
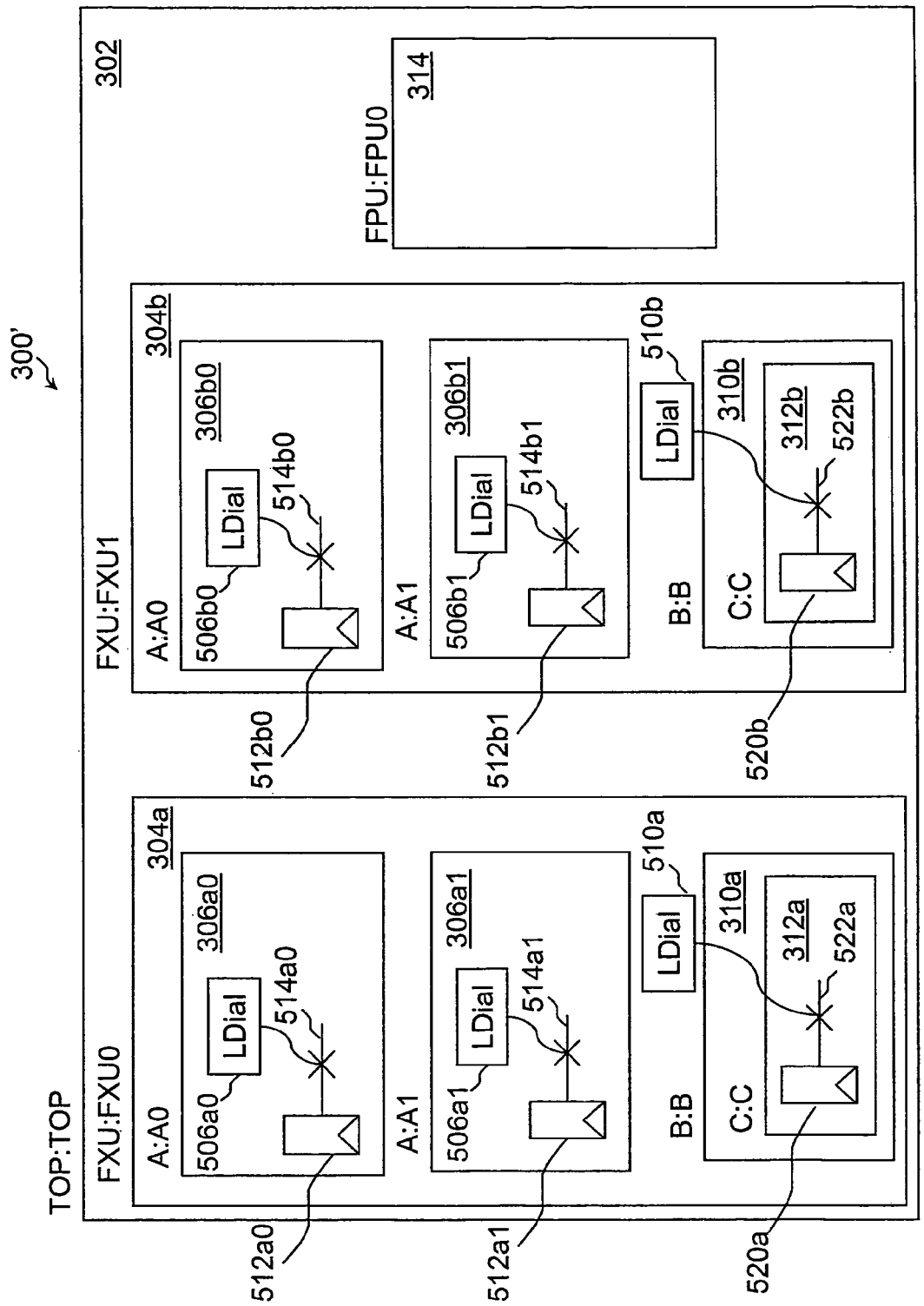
FIG. 5B depicts an exemplary digital design including a plurality of hierarchically arranged design entities in which LDials are instantiated in accordance with the present invention.

With reference now to FIG. 5B, there is illustrated a diagrammatic representation of a simulation model logically including Dials. Simulation model 300' of FIG. 5B, which as indicated by prime notation includes the same design entities arranged in the same hierarchical relation as simulation model 300 of FIG. 3, illustrates two properties of Dials, namely, replication and scope.

Replication is a process by which a Dial that is specified in or referenced by an HDL file of a design entity is automatically instantiated each time that the associated design entity is instantiated. Replication advantageously reduces the amount of data entry a designer is required to perform to create multiple identical instances of a Dial. For example, in order to instantiate the six instances of LDials illustrated in FIG. 5B, the designer need only code two LDial configuration specification statements utilizing either of the two techniques illustrated in FIGS. 4A and 4B. That is, the designer codes a first LDial configuration specification statement (or configuration file reference statement pointing to an associated configuration file) into the HDL file of design entity A 306 in order to automatically instantiate LDials 506a0, 506a1, 506b0 and 506b1 within entity A instantiations 306a0, 306a1, 306b0 and 306b1, respectively. The designer codes a second LDial configuration specification statement (or configuration file reference statement pointing to an associated configuration file) into the HDL file of design entity FXU 304 in order to automatically instantiate LDials 510a and 510b within FXU entity instantiations 304a and 304b, respectively. The multiple instances of the LDials are then created automatically as the associated design entities are replicated by the compiler. Replication of Dials within a digital design can thus significantly reduce the input burden on the designer as compared to prior art methodologies in which the designer had to individually enumerate in the configuration software each configuration latch value by hand. It should be noted that the property of replication does not necessarily require all instances of a Dial to generate the same output values; different instances of the same Dial can be set to generate different outputs by providing them different inputs.

The "scope" of a Dial is defined herein as the set of entities to which the Dial can refer in its specification. By convention, the scope of a Dial comprises the design entity with which the Dial is associated (i.e., the design entity specified by the HDL source file containing the configuration specification statement or configuration file reference statement that causes the Dial to be instantiated) and any design entity contained within the associated design entity (i.e., the associated design entity and its descendents). Thus, a Dial is not constrained to operate at the level of the design hierarchy at which it is instantiated, but can also specify configuration latches at any lower level of the design hierarchy within its scope. For example, LDials 510*a* and 510*b*, even though associated with FXU entity instantiations 304*a* and 304*b*, respectively, can specify configuration latches within entity C instantiations 312*a* and 312*b*, respectively.

FIG. 5B illustrates another important property of LDials (and other Dials that directly specify configuration latches). In particular, as shown diagrammatically in FIG. 5B, designers, who are accustomed to specifying signals in HDL files, are permitted in a configuration specification statement to specify signal states set by a Dial rather than values to be loaded into an "upstream" configuration latch that determines the signal state. Thus, in specifying LDial 506, the designer can specify possible signal states for a signal 514 set by a configuration latch 512. Similarly, in specifying LDial 510, the designer can specify possible signal states for signal 522 set by configuration latch 520. The ability to specify signal states rather than latch values not only coincides with designers' customary manner of thinking about a digital design, but also reduces possible errors introduced by the presence of inverters between the configuration latch 512, 520 and the signal of interest 514, 522, as discussed further below.

Figure 5C:
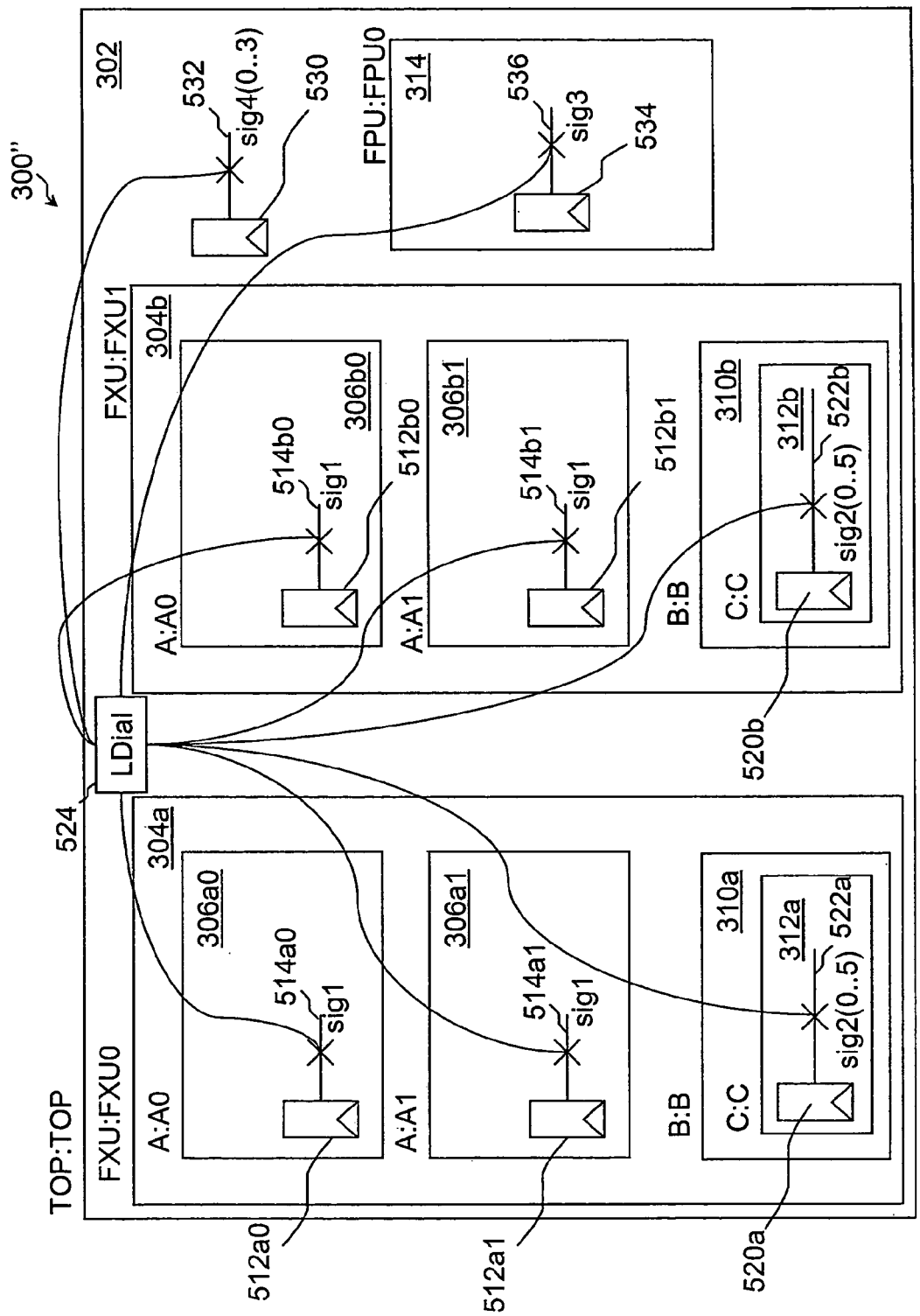
FIG. 5C illustrates an exemplary digital design including a plurality of hierarchically arranged design entities in which an LDial is employed to configure signal states at multiple different levels of the design hierarchy.

Referring now to FIG. 5C, there is depicted another diagrammatic representation of a simulation model including an LDial. As indicated by prime notation, simulation model 300″ of FIG. 5C includes the same design entities arranged in the same hierarchical relation as simulation model 300 of FIG. 3.

As shown, simulation model 300″ of FIG. 5C includes an LDial 524 associated with top-level design entity 302. LDial 524 specifies the signal states of each signal sig1 514, which is determined by a respective configuration latch 512, the signal states of each signal sig2 522, which is determined by a respective configuration latch 520, the signal state of signal sig4 532, which is determined by configuration latch 530, and the signal state of signal sig3 536, which is determined by configuration latch 534. Thus, LDial 524 configures the signal states of numerous different signals, which are all instantiated at or below the hierarchy level of LDial 524 (which is the top level).

As discussed above with respect to FIGS. 4A and 4B, LDial 524 is instantiated within top-level entity 302 of simulation model 300″ by embedding within the HDL file of top-level entity 302 a configuration specification statement specifying LDial 524 or a configuration file reference statement referencing a separate configuration file containing a configuration specification statement specifying LDial 524. In either case, an exemplary configuration specification statement for LDial 524 is as follows:

```
LDial bus ratio (FXU0.A0.SIG1, FXU0.A1.SIG1,
    FXU0.B.C.SIG2(0..5),
    FXU1.A0.SIG1, FXU1.A1.SIG1,
    FXU1.B.C.SIG2(0..5),
    FPU0.SIG3, SIG4(0..3)
) =
{2:1 =>0b0, 0b0, 0x00,
    0b0, 0b0, 0x00,
    0b0, 0x0;
 3:1 => 0b1, 0b1, 0x01,
    0b1, 0b1, 0x01,
    0b0, 0x1;
 4:1 => 0b1, 0b1, 0x3F,
    0b1, 0b1, 0x3F,
    0b1, 0xF
};
```

The exemplary configuration specification statement given above begins with the keyword "LDial," which specifies that the type of Dial being declared is an LDial, and the Dial name, which in this case is "bus ratio." Next, the configuration specification statement enumerates the signal names whose states are controlled by the LDial. As indicated above, the signal identifier for each signal is specified hierarchically (e.g., FXU0.A0.SIG1 for signal 514*a*0) relative to the default scope of the associated design entity so that different signal instances having the same signal name are distinguishable. Following the enumeration of the signal identifiers, the configuration specification statement includes a mapping table listing the permitted enumerated input values of the LDial and the corresponding signal values for each enumerated input value. The signal values are associated with the signal names implicitly by the order in which the signal names are declared. It should again be noted that the signal states specified for all enumerated values are unique, and collectively represent the only legal patterns for the signal states.

Several different syntaxes can be employed to specify the signal states. In the example given above, signal states are specified in either binary format, which specifies a binary constant preceded by the prefix "0b", or in hexadecimal format, which specifies a hexadecimal constant preceded by the prefix "0x". Although not shown, signal states can also be specified in integer format, in which case no prefix is employed. For ease of data entry, the configuration specification language of ECAD system 35 also preferably supports a concatenated syntax in which one constant value, which is automatically extended with leading zeros, is utilized to represent the concatenation of all of the desired signal values. In this concatenated syntax, the mapping table of the configuration specification statement given above can be rewritten as:

```
{2:1 =>    0,
 3:1 =>    0x183821,
 4:1 =>    0x1FFFFF
};
``` in order to associate enumerated input value 2:1 with a concatenated bit pattern of all zeros, to associate the enumerated input value 3:1 with the concatenated bit pattern '0b110000011100000100001', and to associate the enumerated input value 4:1 with a concatenated bit pattern of all ones.

Figure 6:
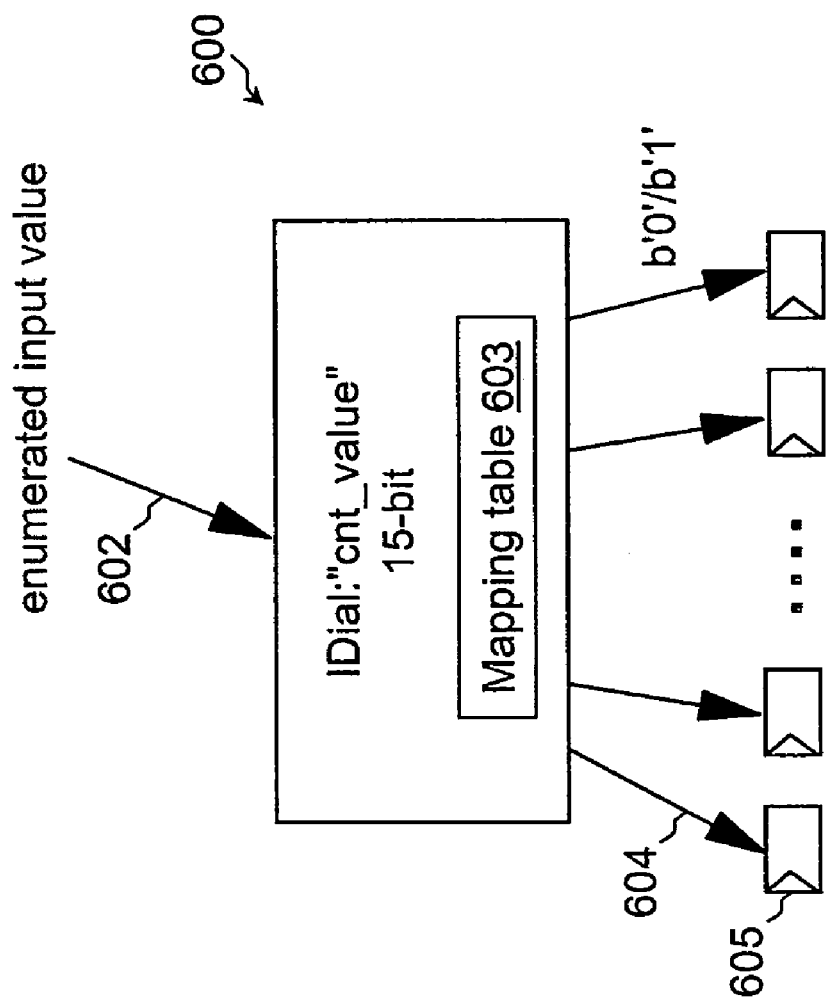
FIG. 6 is a diagrammatic representation of an IDial in accordance with the present invention.

Referring now to FIG. 6, there is depicted a diagrammatic representation of an Integer Dial ("IDial") in accordance with a preferred embodiment of the present invention. Like an LDial, an IDial directly specifies the value loaded into each of one or more configuration latches 605 by indicating within mapping table 603 a correspondence between each input value received at an input 602 and an output value for each output 604. However, unlike LDials, which can only receive as-legal input values the enumerated input values explicitly set forth in their mapping tables 503, the legal input value set of an IDial includes all possible integer values within the bit size of output 604. (Input integer values containing fewer bits than the bit size of output(s) 604 are right justified and extended with zeros to fill all available bits.) Because it would be inconvenient and tedious to enumerate all of the possible integer input values in mapping table 603, mapping table 603 simply indicates the manner in which the integer input value received at input 602 is applied to the one or more outputs 604.

IDials are ideally suited for applications in which one or more multi-bit registers must be initialized and the number of legal values includes most values of the register(s). For example, if a 4-bit configuration register comprising 4 configuration latches and an 11-bit configuration register comprising 11 configuration latches were both to be configured utilizing an LDial, the designer would have to explicitly enumerate up to $2^{15}$ input values and the corresponding output bit patterns in the mapping table of the LDial. This case can be handled much more simply with an IDial utilizing the following configuration specification statement:

IDial cnt_value(sig1(0 . . . 3),sig2(0 . . . 10));

In the above configuration specification statement, "IDial" declares the configuration entity as an IDial, "cnt_value" is the name of the IDial, "sig1" is a 4-bit signal output by the 4-bit configuration register and "sig2" is an 11-bit signal coupled to the 11-bit configuration register. In addition, the ordering and number of bits associated with each of sig1 and sig2 indicate that the 4 high-order bits of the integer input value will be utilized to configure the 4-bit configuration register associated with sig1 and the 11 lower-order bits will be utilized to configure the 11-bit configuration register associated with sig2. Importantly, although mapping table 603 indicates which bits of the integer input values are routed to which outputs, no explicit correspondence between input values and output values is specified in mapping table 603.

Although the configuration of a digital design can be fully specified utilizing LDials alone or utilizing LDials and IDials, in many cases it would be inefficient and inconvenient to do so. In particular, for hierarchical digital designs such as that illustrated in FIG. 5C, the use of LDials and/or IDials alone would force many Dials to higher levels of the design hierarchy, which, from an organizational standpoint, may be the responsibility of a different designer or design group than is responsible for the design entities containing the configuration latches controlled by the Dials. As a result, proper configuration of the configuration latches would require not only significant organizational coordination between design groups, but also that designers responsible for higher levels of the digital design learn and include within their HDL files details regarding the configuration of lower level design entities. Moreover, implementing Dials at higher levels of the hierarchy means that lower levels of the hierarchy cannot be independently simulated since the Dials controlling the configuration of the lower level design entities are not contained within the lower level design entities themselves.

In view of the foregoing, the present invention recognizes the utility of providing a configuration entity that supports the hierarchical combination of Dials to permit configuration of lower levels of the design hierarchy by lower-level Dials and control of the lower-level Dials by one or more higher-level Dials. The configuration specification language of the present invention terms a higher-level Dial that controls one or more lower-level Dials as a Control Dial ("CDial").

Figure 7A:
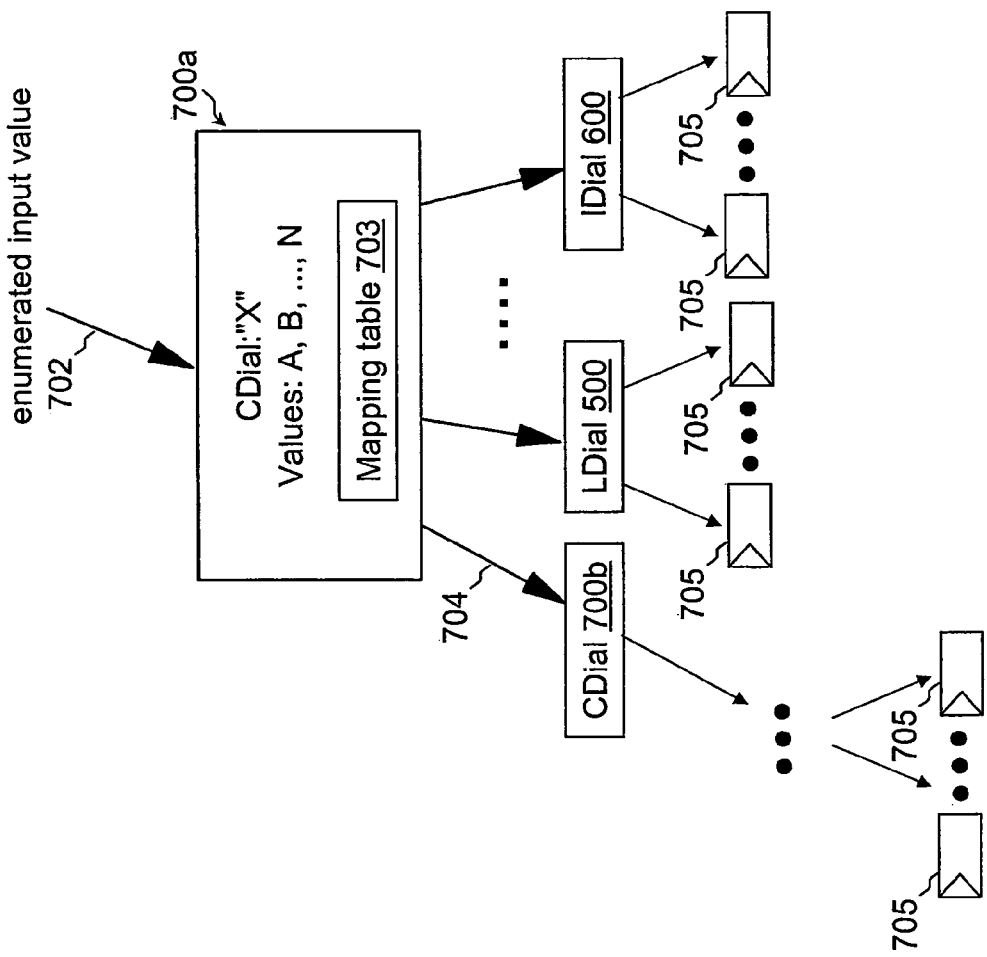
FIG. 7A is a diagrammatic representation of a CDial employed to control other Dials in accordance with the present invention.

Referring now to FIG. 7A, there is depicted a diagrammatic representation of a CDial 700a in accordance with the present invention. CDial 700a, like all Dials, preferably has a single input 702, one or more outputs 704, and a mapping table 703 that maps each input value to a respective associated output value for each output 704. Unlike LDials and IDials, which directly specify configuration latches, a CDial 700 does not directly specify configuration latches. Instead, a CDial 700 controls one or more other Dials (i.e., CDials and/or LDials and/or IDials) logically coupled to CDial 700 in an n-way "Dial tree" in which each lower-level Dial forms at least a portion of a "branch" that ultimately terminates in "leaves" of configuration latches. Dial trees are preferably constructed so that no Dial is instantiated twice in any Dial tree.

In the exemplary embodiment given in FIG. 7A, CDial 700a receives at input 702 an enumerated input value (i.e., a string) among a set of legal values including "A", . . . , "N". If CDial 700a (or an LDial or IDial) is a top-level Dial (i.e., there are no Dials "above" it in a Dial tree), CDial 700a receives the enumerated input value directly from software (e.g., simulation software or firmware). Alternatively, if CDial 700a forms part of a "branch" of a dial tree, then CDial 700a receives the enumerated input value from the output of another CDial. For each legal enumerated input value that can be received at input 702, CDial 700a specifies a selected enumerated value or bit value for each connected Dial (e.g., Dials 700b, 500 and 600) in mapping table 703. The values in mapping table 703 associated with each output 704 are interpreted by ECAD system 35 in accordance with the type of lower-level Dial coupled to the output 704. That is, values specified for LDials and CDials are interpreted as enumerated values, while values specified for IDials are interpreted as integer values. With these values, each of Dials 700b, 500 and 600 ultimately specifies, either directly or indirectly, the values for one or more configuration latches 705.

Figure 7B:
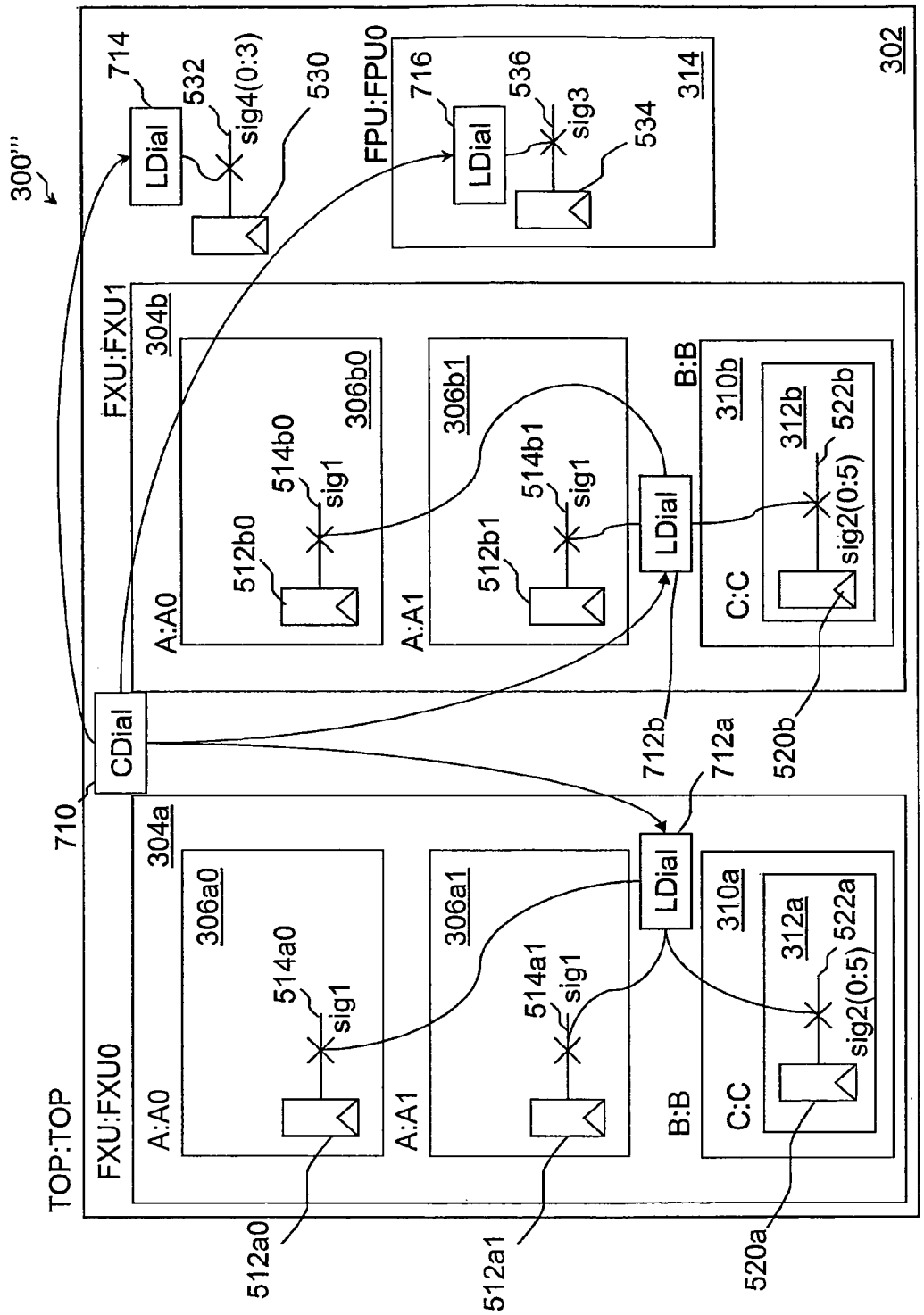
FIG. 7B depicts an exemplary digital design including a plurality of hierarchically arranged design entities in which a CDial is employed to control lower-level Dials utilized to configure signal states.

With reference now to FIG. 7B, there is illustrated another diagrammatic representation of a simulation model containing a Dial tree including a top-level CDial that controls multiple lower-level LDials. As indicated by prime notation, simulation model 300''' of FIG. 7B includes the same design entities arranged in the same hierarchical relation as simulation model 300 of FIG. 3 and contains the same configuration latches and associated signals as simulation model 300'' of FIG. 5C.

As shown, simulation model 300''' of FIG. 7B includes a top-level CDial 710 associated with top-level design entity 302. Simulation model 300''' further includes four LDials 712a, 712b, 714 and 716. LDial 712a, which is associated with entity instantiation A0 304a, controls the signal states of each signal sig1 514a, which is determined by a respective configuration latch 512a, and the signal state of signal sig2 522a, which is determined by configuration latch 520a. LDial 712b, which is a replication of LDial 712a associated with entity instantiation A1 304b, similarly controls the signal states of each signal sig1 514b, which is determined by a respective configuration latch 512b, and the signal state of signal sig2 522b, which is determined by configuration latch 520b. LDial 714, which is associated with top-level entity 302, controls the signal state of signal sig4 532, which is determined by configuration latch 530. Finally, LDial 716, which is associated with entity instantiation FPU0 314, controls the signal state of signal sig3 536, which is determined by configuration latch 534. Each of these four LDials is controlled by CDial 710 associated with top-level entity 302.

As discussed above with respect to FIGS. 4A and 4B, CDial 710 and each of the four LDials depicted in FIG. 7B is instantiated within the associated design entity by embedding a configuration specification statement (or a configuration file reference statement pointing to a configuration file containing a configuration specification statement) within the HDL file of the associated design entity. An exemplary configuration specification statement utilized to instantiate each Dial shown in FIG. 7B is given below:

```
CDial BusRatio (FXU0.BUSRATIO, FXU1.BUSRATIO,
    FPU0.BUSRATIO, BUSRATIO)=
    {2:1 => 2:1, 2:1, 2:1, 2:1;
    2 3:1 => 3:1, 3:1, 3:1, 3:1;
    4:1 => 4:1, 4:1, 4:1, 4:1
    };
LDial BusRatio (A0.sig1, A1.sig1, B.C.sig2(0..5)) =
    {2:1 => 0b0, 0b0, 0x00;
    3:1 => 0b1, 0b1, 0x01;
    4:1 => 0b1, 0b1, 0x3F;
    };
LDial BusRatio (sig3) =
    {2:1 => 0b0;
    3:1 => 0b0;
    4:1 => 0b1
    };
LDial BusRatio (sig4(0..3)) =
    {2:1 => 0x0;
    3:1 => 0x1;
    4:1 => 0xF
    };
```

By implementing a hierarchical Dial tree in this manner, several advantages are realized. First, the amount of software code that must be entered is reduced since the automatic replication of LDials 712 within FXU entity instantiations 304a and 304b allows the code specifying LDials 712 to be entered only once. Second, the organizational boundaries of the design process are respected by allowing each designer (or design team) to specify the configuration of signals within the design entity for which he is responsible. Third, coding of upper level Dials (i.e., CDial 710) is greatly simplified, reducing the likelihood of errors. Thus, for example, the CDial and LDial collection specified immediately above performs the same function as the "large" LDial specified above with reference to FIG. 5C, but with much less complexity in any one Dial.

Many Dials, for example, those utilized to disable a particular design entity in the event an uncorrectable error is detected, have a particular input value that the Dial should have in nearly all circumstances. For such Dials, the configuration specification language of the present invention permits a designer to explicitly specify in a configuration specification statement a default input value for the Dial. In an exemplary embodiment, a Default value is specified by including "=default value" following the specification of a Dial and prior to the concluding semicolon. For example, a default value for a CDial, can be given as follows:

```
CDial BusRatio (FXU0.BUSRATIO, FXU1.BUSRATIO,
    FPU0.BUSRATIO, BUSRATIO)=
    {2:1 => 2:1, 2:1, 2:1, 2:1;
    3:1 => 3:1, 3:1, 3:1, 3:1;
    4:1 => 4:1, 4:1, 4:1, 4:1
    } = 2:1;
```

It should be noted that for CDials and LDials, the specified default value is required to be one of the legal enumerated values, which are generally (i.e., except for Switches) listed in the mapping table. For Switches, the default value must be one of the predefined enumerated values of "ON" and "OFF".

A default value for an IDial can similarly be specified as follows:

```
IDial cnt_value(A0.sig1(0..7), A0.sig2(8..14);
    A1.sig1(0..7), A1.sig2(8..14);
    A3.sig1(0..7), A3.sig2(8..14)
    ) = 0x7FFF;
```

In this case, a constant, which can be given in hexadecimal, decimal or binary format, provides the default output value of each signal controlled by the IDial. In order to apply the specified constant to the indicated signal(s), high order bits are truncated or padded with zeros, as needed.

The configuration specification language of the present invention also permits control of the time at which particular default values are applied. Control of the application of defaults is important, for example, in simulating or executing in hardware the boot sequence for an integrated circuit. During the initial stages of the boot sequence, the clock signals to different sections of the integrated circuit may be started at different times, meaning that latches in different sections of the integrated circuit must be loaded at different times in accordance with the specified Dial default values.

In accordance with the present invention, control of the timing of the application of default values is supported through the association of one or more phase identifiers (IDs) with a default value. Phase IDs are strings that label collections of Dials to which default values should be applied substantially concurrently. Multiple phase IDs may be associated with a particular Dial to promote flexibility. For example, in different system configurations, the boot sequence for a constituent integrated circuit may be different. Accordingly, it may be necessary or desirable to apply a default value to a particular Dial during different phases, depending upon the system configuration.

In one exemplary syntax, one or more phase IDs (e.g., phaseid0 and phaseid1) can optionally be specified in a comma delimited list enclosed by parenthesis and following a default declaration in a Dial declaration statement as follows:

```
CDial BusRatio (FXU0.BUSRATIO, FXU1.BUSRATIO,
    FPU0.BUSRATIO, BUSRATIO)=
    {2:1 => 2:1, 2:1, 2:1, 2:1;
    3:1 => 3:1, 3:1, 3:1, 3:1;
    4:1 => 4:1, 4:1, 4:1, 4:1
    } = 2:1 (phaseid0, phaseid1);
```

It is preferably an error to specify a phase ID for a Dial for which no default value is specified, and as noted above, the specification of any phase ID is preferably entirely optional, as indicated by the exemplary CDial and IDial declarations given previously.

The use of default values for Dials is subject to a number of rules. First, a default value may be specified for any type of Dial including LDials, IDials (including those with split outputs) and CDials. Default values are preferably not supported for Dial groups (which are discussed in the above-referenced application). Second, if default values are specified for multiple Dials in a multiple-level Dial tree, only the highest-level default value affecting each "branch" of the Dial tree is applied (including that specified for the top-level Dial), and the remaining default values, if any, are ignored. Despite this rule, it is nevertheless beneficial to specify default values for lower-level Dials in a Dial tree because the default values may be applied in the event a smaller portion of a model is independently simulated, as discussed above. In the event that the combination of default values specified for lower-level Dials forming the "branches" of a Dial tree do not correspond to a legal output value set for a higher-level Dial, the compiler will flag an error. Third, a default value is overridden when a Dial receives an input to actively set the Dial.

By specifying default values for Dials, a designer greatly simplifies use of Dials by downstream organizational groups by reducing the number of Dials that must be explicitly set for simulation or hardware configuration. In addition, as discussed further below, use of default values assists in auditing which Dials have been actively set.

In addition to defining syntax for configuration specification statements specifying Dials, the configuration specification language of the present invention supports additional HDL semantic constructs called comments and attribute specification statements. A comment, which may have the form:

BusRatio.comment="The bus ratio Dial configures the circuit in accordance with a selected processor/ interconnect frequency ratio";

permits designers to associate arbitrary strings delimited by quotation marks with particular Dial names. As discussed below with reference to FIG. 8, these comments are processed during compilation and included within a configuration documentation file in order to explain the functions, relationships, and appropriate settings of the Dials.

Attribute specification statements are statements that declare an attribute name and attribute value and associate the attribute name with a particular Dial name. For example, an attribute specification statement may have the form:

BusRatio.attribute(myattribute)=scom57(0:9);

In this example, "BusRatio.attribute" declares that this statement is an attribute specification statement associating an attribute with a Dial having "BusRatio" as its Dial name, "myattribute" is the name of the attribute, and "scom57(0:9)" is a string that specifies the attribute value. Attributes support custom features and language extensions to the base configuration specification language.

In accordance with the present invention, the configuration specification language may also support bias specification statements. Bias specification statements enable the designer to specify a set of probabilities or biasing weights to be applied to the various Dials in a digital design. As will become apparent, such biasing weights can then be utilized in simulation and/or lab testing to automatically control the probability that specified Dials are set to particular ones of their legal settings, thereby reducing or eliminating the need for designers to communicate Dial setting information to the simulation and laboratory testing teams outside of the testing system.

In one preferred embodiment, the configuration specification language of the present invention permits a designer to specify a set of biasing weights for one or more input values of a Dial as integer values. For example, for a Dial entity having three legal input values {A, B, and C}, a set of biasing weights for instances of the Dial entity could be A=10, B=10, and C=20. The enumerated biasing weights are then effectively scaled based upon their cumulative value so that the input value of the Dial instances would be set to value A with a 25% probability, to value B with a 25% probability, and to value C with a 50% probability in response to an API call.

For enhanced flexibility, it is also desirable if multiple different sets of biasing weights are supported. The different sets of biasing weights may be utilized for example, to define separate sets of biasing weights for different types of simulation testing and/or for simulation and laboratory testing. To simplify reference to the various sets of biasing weights, each set of biasing weights may be given a designer-assigned name, which is unique with respect to other biasing weight set names for the same Dial. In addition, it is preferable if the namespace of biasing weights for each Dial supports a special "nameless" set that is implicitly identified in declaration syntax and API calls by a NULL string parameter.

Those skilled in the art will appreciate that a number of different syntaxes can be employed to specify biasing weights for Dials in accordance with the present invention. Biasing weights can conveniently be enumerated using syntax similar to attribute specification statements, particularly when multiple named sets of biasing weights are specified. Alternatively or additionally, the syntax for biasing weights can be integrated directly into a Dial declaration statement.

For example, consider again the CDial declaration statement set forth previously:

```
CDial BusRatio (FXU0.BUSRATIO, FXU1.BUSRATIO,
    FPU0.BUSRATIO, BUSRATIO)=
    {2:1 => 2:1, 2:1, 2:1, 2:1;
    3:1 => 3:1, 3:1, 3:1, 3:1;
    4:1 => 4:1, 4:1, 4:1, 4:1
    } = 2:1;
``` which declares a CDial named BusRatio having legal input values 2:1, 3:1 and 4:1, each having an associated set of output values. The CDial BusRatio also has a default input value of 2:1, which is applied if CDial BusRatio is not explicitly set. To declare three sets of biasing weights for the CDial, the following bias specification statement can be employed:

```
BusRatio.biases = {unitsim; (2:1, 10), (3:1, 20), (4:1, 10)},
    {(2:1, 20), (3:1, 20), (4:1, 20)},
    {labsim; (2:1: 50), 50};
```

In this exemplary bias specification statement, the statement is identified as a bias specification statement of the CDial BusRatio by specifying its dialname following by a period (".") and the identifier "biases." Each of the three sets of biasing weights is then enclosed within a set of braces "{" and "}", where biasing weights for individual Dial input values are listed in comma delimited parenthetical duples including an Dial input value and associated biasing weight. The bias specification statement terminates with a semicolon. As noted above, each set of biasing weights can be given an optional name, which is specified at the beginning of the set and, if present, is followed by a semicolon. All biasing weights for a given Dial are preferably required by a compiler (described below) to be specified in one statement, and within the bias specification statements, the names for each set of biasing weights, including "nameless" sets, are preferably required to be unique.

The foregoing exemplary bias specification statement also illustrates multiple ways to specify biasing weights. First, an explicit biasing weight can be specified for each legal Dial input value, as is provided for the "unitsim" and "nameless" sets of biasing weights. Second, the designer can specify biasing weights for one or more Dial input values in a set and then specify a single group biasing weight (which is enumerated without an associated Dial input value) that is applied to the remaining Dial input values that are not explicitly paired with a biasing weight. In other words, the group biasing weight is applied to all unspecified Dial input values. For example, in the "labsim" set of biasing weights, the 2:1 Dial input value is applied with a 50% probability, and the Dial input value is randomly selected from among the other unspecified Dial input values with a 50% probability.

The availability of group bias weights is particularly useful for IDials because, for an IDial of any significant size, it would be a laborious to specify biasing weights for all possible Dial input values. Thus, biasing weights for an IDial such as the following:

```
IDial cnt_value(A0.sig1(0..7), A0.sig2(8..14);
    A1.sig1(0..7), A1.sig2(8..14);
    A3.sig1(0..7), A3.sig2(8..14)
    ) = 0x7FFF;
``` can be easily and compactly expressed with the following bias specification statement:

```
cnt_value.biases={unitsim;(0x0000,20),(0x0001,20),
    20)};
```

This bias specification statement specifies an exemplary set of biasing weights named "unitsim," which sets the Dial input value to 0 with a probability of 33.33%, to the value is 1 with a probability of 33.33%, and to a random value other than 0 or 1 (and of appropriate size) with a probability of 33.33%.

Those skilled in the art will recognize that the syntax set forth herein is merely exemplary and that other variations and extensions and features may be employed in accordance with the present invention. For example, as noted above, the configuration specification language may alternatively or additionally permit biasing weights to be enumerated directly within a Dial declaration statement. For example, a "nameless" set of biasing weights can be specified within the Dial declaration statement of exemplary CDial BusRatio as follows:

```
CDial BusRatio (FXU0.BUSRATIO, FXU1.BUSRATIO,
    FPU0.BUSRATIO, BUSRATIO)=
    {2:1, 40 => 2:1, 2:1, 2:1, 2:1;
    3:1, 20 => 3:1, 3:1, 3:1, 3:1;
    4:1, 20 => 4:1, 4:1, 4:1, 4:1
    } = 2:1;
```

In this example, the Dial input value has a 50% probability of being set to 2:1, a 25% probability of being set to 3:1, and a 25% probability of being set to 4:1 in response to an API call. The syntax for biasing weights may also be extended to support the specification of ranges of Dial input values for IDials or to explicitly enumerate the Dial input values to which a group biasing weight is applied.

As with the defaults discussed above, biasing weights can be specified by a designer for multiple Dials in a multiple-level Dial tree. However, biasing weights are preferably applied for only top-level Dials, and biasing weights specified for lower-level Dials, if any, are ignored. Despite this rule, it is nevertheless beneficial to specify biasing weights for lower-level Dials in a Dial tree because the biasing weights may be applied in the event a smaller portion of a digital is independently tested.

Figure 8:
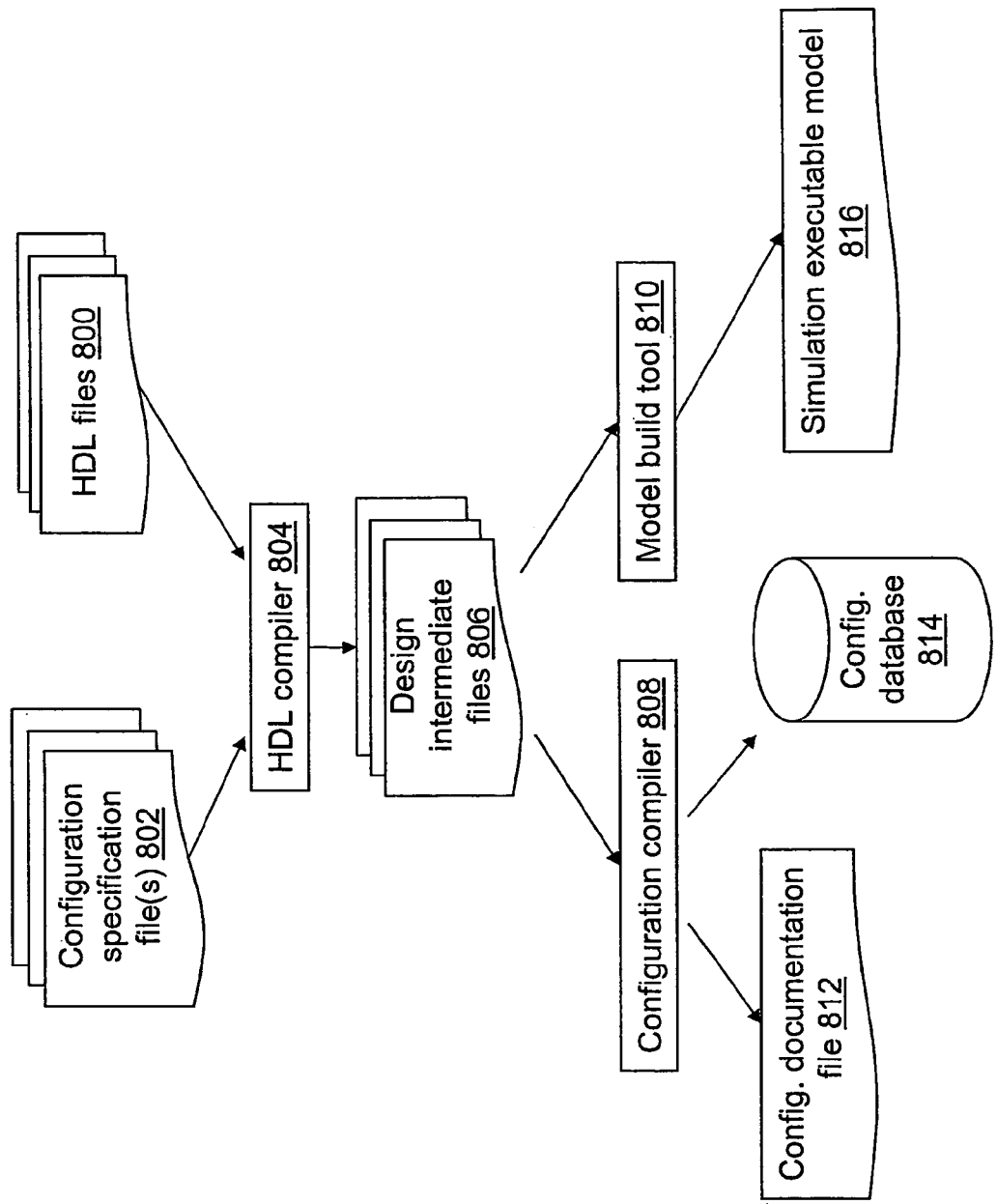
FIG. 8 is a high level flow diagram of a model build process utilized to produce a simulation executable model and associated simulation configuration database in accordance with the present invention.

Referring now to FIG. 8, there is depicted a high level flow diagram of a model build process in which HDL files containing configuration statements are compiled to obtain a simulation executable model and a simulation configuration database for a digital design. The process begins with one or more design entity HDL source code files 800, which include configuration specification statements and/or configuration file reference statements, and, optionally, one or more configuration specification reference files 802. HDL compiler 804 processes HDL file(s) 800 and configuration specification file(s) 802, if any, beginning with the top level entity of a simulation model and proceeding in a recursive fashion through all HDL file(s) 800 describing a complete simulation model. As HDL compiler 804 processes each HDL file 800, HDL compiler 804 creates "markers" in the design intermediate files 806 produced in memory to identify configuration statements embedded in the HDL code and any configuration specification files referenced by an embedded configuration file reference statement.

Thereafter, the design intermediate files 806 in memory are processed by a configuration compiler 808 and model build tool 810 to complete the model build process. Model build tool 810 processes design intermediate files 806 into a simulation executable model 816, that when executed, models the logical functions of the digital design, which may represent, for example, a portion of an integrated circuit, an entire integrated circuit or module, or a digital system including multiple integrated circuits or modules. Configuration compiler 808 processes the configuration specification statements marked in design intermediate files 806 and creates from those statements a configuration documentation file 812 and a configuration database 814.

Configuration documentation file 812 lists, in human-readable format, information describing the Dials associated with the simulation model. The information includes the Dials' names, their mapping tables, the structure of Dial trees, if any, instance information, etc. In addition, as noted above, configuration documentation file 812 includes strings contained in comment statements describing the functions and settings of the Dials in the digital design. In this manner, configuration documentation suitable for use with both a simulation model and a hardware implementation of a digital design is aggregated in a "bottom-up" fashion from the designers responsible for creating the Dials. The configuration documentation is then made available to all downstream organizational groups involved in the design, simulation, laboratory hardware evaluation, and commercial hardware implementation of the digital design.

Configuration database 814 contains a number of data structures pertaining to Dials. As described in detail below, these data structures include Dial data structures describing Dial entities, latch data structures, and Dial instance data structures. These data structures associate particular Dial inputs with particular configuration values used to configure the digital design (i.e., simulation executable model 816). In a preferred embodiment, the configuration values can be specified in terms of either signal states or configuration latch values, and the selection of which values are used is userselectable. Configuration database 814 is accessed via Application Programming Interface (API) routines during simulation of the digital design utilizing simulation executable model 816 and is further utilized to generate similar configuration databases for configuring physical realizations of the digital design. In a preferred embodiment, the APIs are designed so that only top-level Dials (i.e., LDials, IDials or CDials without a CDial logically "above" them) can be set and all Dial values can be read.

Now that basic types of Dials, syntax for their specification, and their application have been described, a description of an exemplary implementation of configuration database 814 and its use will be provided. To promote understanding of the manner in which particular Dial instantiations (or multiple instantiations of a Dial) can be accessed in configuration database 814, a nomenclature for Dials within configuration database 814 will be described.

The nomenclature employed in a preferred embodiment of the present invention first requires a designer to uniquely name each Dial specified within any given design entity, i.e., the designer cannot declare any two Dials within the same design entity with the same Dial name. Observing this requirement prevents name collisions between Dials instantiated in the same design entity and promotes the arbitrary re-use of design entities in models of arbitrary size. This constraint is not too onerous in that a given design entity is usually created by a specific designer at a specific point in time, and maintaining unique Dial names within such a limited circumstance presents only a moderate burden.

Because it is desirable to be able to individually access particular instantiations of a Dial entity that may have multiple instantiations in a given simulation model (e.g., due to replication), use of a Dial name alone is not guaranteed to uniquely identify a particular Dial entity instantiation in a simulation model. Accordingly, in a preferred embodiment, the nomenclature for Dials leverages the unique instantiation identifier of the associated design entity required by the native HDL to disambiguate multiple instances of the same Dial entity with an "extended Dial identifier" for each Dial within the simulation model.

As an aside, it is recognized that some HDLs do not strictly enforce a requirement for unique entity names. For example, conventional VHDL entity naming constructs permit two design entities to share the same entity name, entity_name. However, VHDL requires that such identically named entities must be encapsulated within different VHDL libraries from which a valid VHDL model may be constructed. In such a circumstance, the entity_name is equivalent to the VHDL library name concatenated by a period (".") to the entity name as declared in the entity declaration. Thus, pre-pending a distinct VHDL library name to the entity name disambiguates entities sharing the same entity name. Most HDLs include a mechanism such as this for uniquely naming each design entity.

In a preferred embodiment, an extended Dial identifier that uniquely identifies a particular instantiation of a Dial entity includes three fields: an instantiation identifier field, a design entity name, and a Dial name. The extended Dial identifier may be expressed as a string in which adjacent fields are separated by a period (".") as follows:

<instantiation identifier>.<design entity name>.<Dial name>

In the extended Dial identifier, the design entity field contains the entity name of the design entity in which the Dial is instantiated, and the Dial name field contains the name declared for the Dial in the Dial configuration specification statement. As described above, the instantiation identifier specified in the instantiation identifier field is a sequence of instantiation identifiers, proceeding from the top-level entity of the simulation model to the direct ancestor design entity of the given Dial instance, with adjacent instance identifiers separated by periods ("."). Because no design entity can include two Dials of the same name, the instantiation identifier is unique for each and every instance of a Dial within the model.

The uniqueness of the names in the design entity name field is a primary distinguishing factor between Dials. By including the design entity name in the extended Dial identifier, each design entity is, in effect, given a unique namespace for the Dials associated with that design entity, i.e., Dials within a given design entity cannot have name collisions with Dials associated with other design entities. It should also be noted that it is possible to uniquely name each Dial by using the instantiation identifier field alone. That is, due to the uniqueness of instantiation identifiers, Dial identifiers formed by only the instantiation identifier field and the Dial name field will be necessarily unique. However, such a naming scheme does not associate Dials with a given design entity. In practice, it is desirable to associate Dials with the design entity in which they occur through the inclusion of the design entity field because all the Dials instantiations can then be centrally referenced without the need to ascertain the names of all the design entity instantiations containing the Dial.

Figure 9:
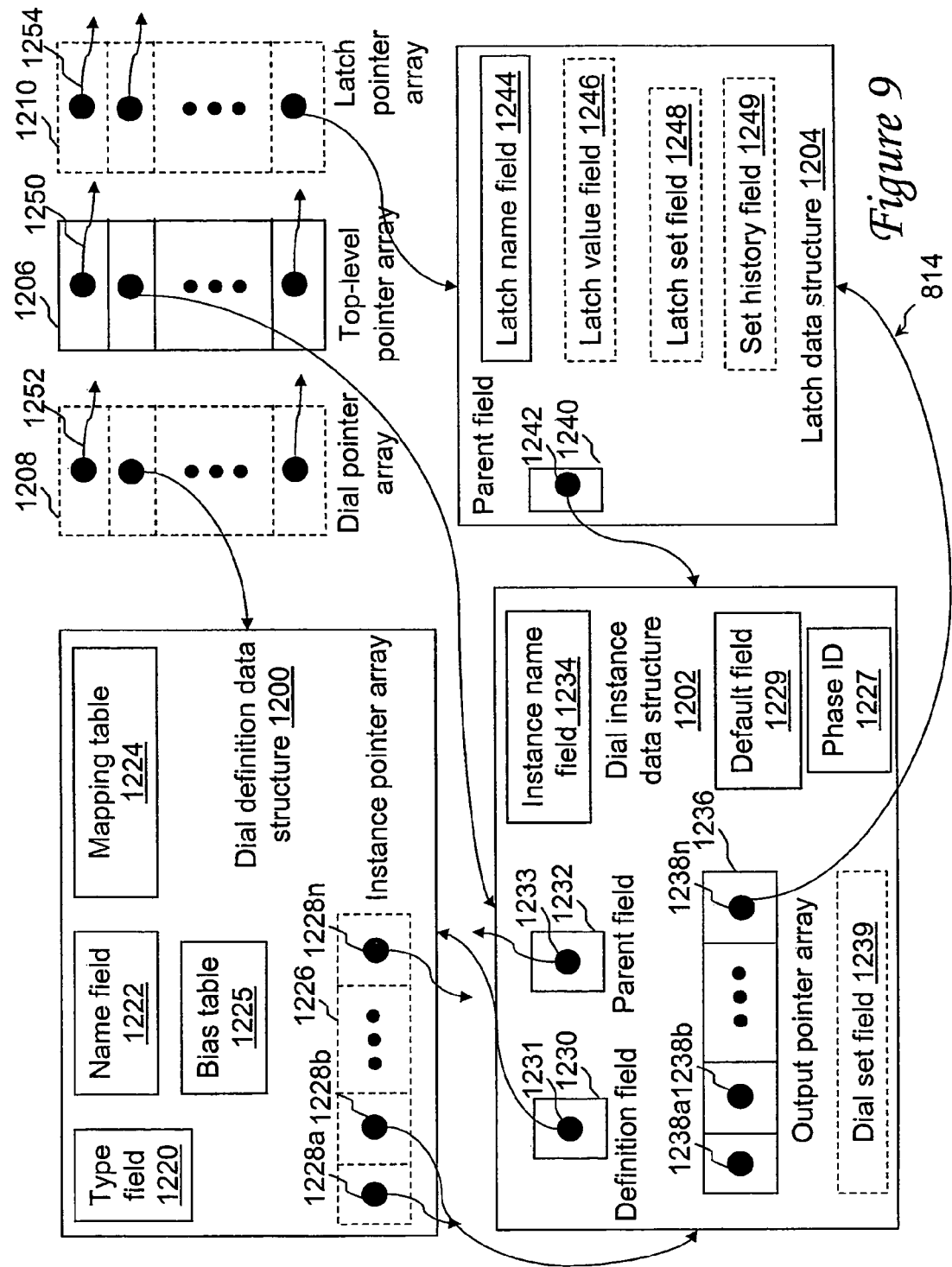
FIG. 9 depicts an exemplary embodiment of a simulation configuration database in accordance with the present invention.

With an understanding of a preferred nomenclature of Dials, reference is now made to FIG. 9, which is a diagrammatic representation of an exemplary format for a configuration database 814 created by configuration compiler 808. In this exemplary embodiment, configuration database 814 includes at least four different types of data structures: Dial definition data structures (DDDS) 1200, Dial instance data structures (DIDS) 1202, latch data structures 1204 and top-level pointer array 1206. Configuration database 814 may optionally include additional data structures, such as Dial pointer array 1208, latch pointer array 1210, instance pointer array 1226 and other data structures depicted in dashed-line illustration, which may alternatively be constructed in volatile memory when configuration database 814 is loaded, as described further below. Generating these additional data structures only after configuration database 814 is loaded into volatile memory advantageously promotes a more compact configuration database 814.

A respective Dial definition data structure (DDDS) 1200 is created within configuration database 814 for each Dial or Dial group in the digital system. Preferably, only one DDDS 1200 is created in configuration database 814 regardless of the number of instantiations of the Dial (or Dial group) in the digital system. As discussed below, information regarding particular instantiations of a Dial described in a DDDS 1200 is specified in separate DIDSs 1202.

As shown, each DDDS 1200 includes a type field 1220 denoting the type of Dial. In one embodiment, the value set for type field 1220 includes "G" for Dial group, "I" for integer Dial (IDial), "L" for latch Dial (LDial), and "C" for control Dial (CDial). DDDS 1200 further includes a name field 1222, which specifies the name of the Dial described by DDDS 1200. This field preferably contains the design entity name of the Dial, followed by a period ("."), followed by the name of Dial (or Dial group) given in the configuration specification statement of the Dial (or Dial group). The contents of name field 1222 correspond to the design entity name and Dial name fields of the extended dial identifier for the Dial.

DDDS 1200 also includes a mapping table 1224 that contains the mapping from the input of the given Dial to its output(s), if required. For LDials and CDials, mapping table 1224 specifies relationships between input values and output values much like the configuration specification statements for these Dials. For Dial groups and IDials not having a split output, mapping table 1220 is an empty data structure and is not used. In the case of an IDial with a split output, mapping table 1220 specifies the width of the replicated integer field and the number of copies of that field. This information is utilized to map the integer input value to the various copies of the integer output fields.

For Dials for which one or more sets of biasing weights are specified by the designer, DDDS 1200 further includes a bias table 1225 that contains one or more sets of biasing weights and associated name(s), if any. Bias table 1225 is preferably used to set only top-level Dial instances of any given model. Bias table 1225 may further include an identifier (e.g., name or NULL string) of a currently applied set of biasing weights.

Finally, DDDS 1200 may include an instance pointer array 1226 containing one or more instance pointers 1228a-1228n pointing to each instance of the Dial or Dial group defined by the DDDS 1200. Instance pointer array 1226 facilitates access to multiple instances of a particular Dial or Dial group.

As further illustrated in FIG. 9, configuration database 814 contains a DIDS 1202 corresponding to each Dial instantiation or Dial group instantiation within a digital design. Each DIDS 1202 contains a definition field 1230 containing a definition pointer 1231 pointing to the DDDS 1200 of the Dial for which the DIDS 1202 describes a particular instance. Definition pointer 1231 permits the Dial name, Dial type and mapping table of an instance to be easily accessed once a particular Dial instance is identified.

DIDS 1202 further includes a parent field 1232 that, in the case of an IDial, CDial or LDial, contains a parent pointer 1233 pointing to the DIDS 1202 of the higher-level Dial instance, if any, having an output logically connected to the input of the corresponding Dial instance. In the case of a Dial group, parent pointer 1233 points to the DIDS 1202 of the higher-level Dial group, if any, that hierarchically includes the present Dial group. If the Dial instance corresponding to a DIDS 1202 is a top-level Dial and does not belong to any Dial group, parent pointer 1233 in parent field 1232 is a NULL pointer. It should be noted that a Dial can be a top-level Dial, but still belong to a Dial group. In that case, parent pointer 1233 is not NULL, but rather points to the DIDS 1202 of the Dial group containing the top-level Dial.

Thus, parent fields 1232 of the DIDSs 1202 in configuration database 814 collectively describe the hierarchical arrangement of Dial entities and Dial groups that are instantiated in a digital design. As described below, the hierarchical information provided by parent fields 1232 advantageously enables a determination of the input value of any top-level Dial given the configuration values of the configuration latches ultimately controlled by that top-level Dial.

Instance name field 1234 of DIDS 1202 gives the fully qualified instance name of the Dial instance described by DIDS 1202 from the top-level design entity of the digital design. For Dial instances associated with the top-level entity, instance name field 1234 preferably contains a NULL string.

DIDS 1202 may further include a default field 1229, a phase ID field 1227, and a Dial set field 1239. At compile time, configuration compiler 808 preferably initially inserts a default field 1229 into at least each DIDS 1202 for which the configuration specification statement for the associated Dial has a default specified. Default field 1229 stores the specified default value; if no default value is specified, default field 1229 is NULL or is omitted. Configuration compiler 808 subsequently analyzes configuration database 814 utilizing a recursive traversal and removes (or set to NULL) the default field 1229 of any Dial instance that has an ancestor Dial instance having a default. In this manner, default values of Dial instances higher in the hierarchy override defaults specified for lower level Dial instances. For each remaining (or non-NULL) default field 1229, configuration compiler 808 inserts into the DIDS 1202 a phase ID field 1227 for storing one or more phase IDs, if any, associated with the default value. The phase ID(s) stored within phase ID field 1227 may be specified within a Dial definition statement within an HDL file 800 or configuration specification file 802, or may alternatively be supplied by direct manipulation of configuration database 814 by a downstream user, as discussed further below with respect to FIG. 15C.

As indicated by dashed-line notation, a Dial set field 1239 is preferably inserted within each DIDS 1302 in configuration database 814 when configuration database 814 is loaded into volatile memory. Dial set field 1239 is a Boolean-valued field that in initialized to FALSE and is updated to TRUE when the associated Dial instance is explicitly set.

Finally, DIDS 1202 includes an output pointer array 1236 containing pointers 1238a-1238n pointing to data structures describing the lower-level instantiations associated with the corresponding Dial instance or Dial group instance. Specifically, in the case of IDials and LDials, output pointers 1238 refer to latch data structures 1204 corresponding to the configuration latches coupled to the Dial instance. For non-split IDials, the configuration latch entity referred to by output pointer 1238a receives the high order bit of the integer input value, and the configuration latch entity referred to by output pointer 1238n receives the low order bit of the integer input value. In the case of a CDial, output pointers 1238 refer to other DIDSs 1202 corresponding to the Dial instances controlled by the CDial. For Dial groups, output pointers 1238 refer to the top-level Dial instances or Dial group instances hierarchically included within the Dial group instance corresponding to DIDS 1202.

Configuration database 814 further includes a respective latch data structure 1204 for each configuration latch in simulation executable model 816 to which an output of an LDial or IDial is logically coupled. Each latch data structure 1204 includes a parent field 1240 containing a parent pointer 1242 to the DIDS 1200 of the LDial or IDial directly controlling the corresponding configuration latch. In addition, latch data structure 1204 includes a latch name field 1244 specifying the hierarchical latch name, relative to the entity containing the Dial instantiation identified by parent pointer 1242. For example, if an LDial X having an instantiation identifier a.b.c refers to a configuration latch having the hierarchical name "a.b.c.d.latch1", latch name field 1244 will contain the string "d.latch1". Prepending contents of an instance name field 1234 of the DIDS 1202 identified by parent pointer 1242 to the contents of a latch name field 1244 thus provides the fully qualified name of any instance of a given configuration latch configurable utilizing configuration database 814.

Still referring to FIG. 9, as noted above, configuration database 814 includes top-level pointer array 1206, and optionally, Dial pointer array 1208 and latch pointer array 1210. Top-level pointer array 1206 contains top-level pointers 1250 that, for each top-level Dial and each top-level Dial group, points to an associated DIDS 1202 for the top-level entity instance. Dial pointer array 1208 includes Dial pointers 1252 pointing to each DDDS 1200 in configuration database 814 to permit indirect access to particular Dial instances through Dial and/or entity names. Finally, latch pointer array 1210 includes latch pointers 1254 pointing to each latch data structure 1204 within configuration database 814 to permit easy access to all configuration latches.

Once a configuration database 814 is constructed, the contents of configuration database 814 can be loaded into volatile memory, such as system memory 18 of data processing system 8 of FIG. 1, in order to appropriately configure a simulation model for simulation. In general, data structures 1200, 1202, 1204 and 1206 can be loaded directly into system memory 18, and may optionally be augmented with additional fields, as described below. However, as noted above, if it is desirable for the non-volatile image of configuration database 814 to be compact, it is helpful to generate additional data structures, such as Dial pointer array 1208, latch pointer array 1210 and instance pointer arrays 1226, in the volatile configuration database image in system memory 18.

Figure 10:
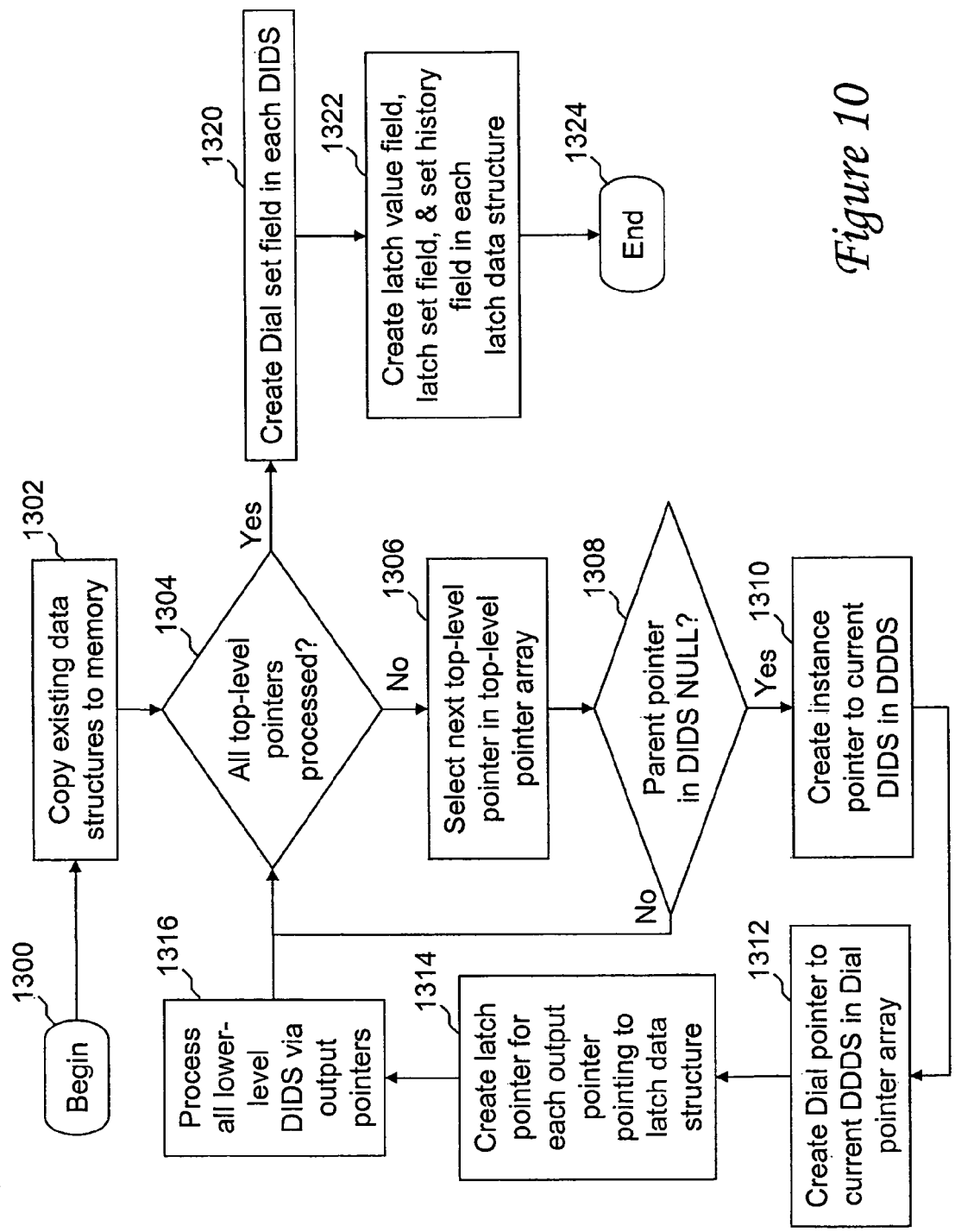
FIG. 10 is a high level logical flowchart of a illustrative method by which a configuration database is expanded within volatile memory of a data processing system in accordance with the present invention.

Referring now to FIG. 10, there is depicted a high level logical flowchart of an exemplary method by which configuration database 814 is expanded within volatile memory of a data processing system, such as system memory 18 of data processing system 8. Because FIG. 10 depicts logical steps rather than operational steps, it should be understood that many of the steps illustrated in FIG. 10 may be performed concurrently or in a different order than that shown.

As illustrated, the process begins at block 1300 and then proceeds to block 1302, which illustrates data processing system 6 copying the existing data structures within configuration database 814 from non-volatile storage (e.g., disk storage or flash memory) into volatile system memory 18. Next, at block 1304, a determination is made whether all top-level pointers 1250 within top-level pointer array 1206 of configuration database 814 have been processed. If so, the process passes to block 1320, which is discussed below. If not, the process proceeds to block 1306, which illustrates selection from top-level array 1206 of the next top-level pointer 1250 to be processed.

A determination is then made at block 1308 of whether or not parent pointer 1233 within the DIDS 1202 identified by the selected top-level pointer 1250 is a NULL pointer. If not, which indicates that the DIDS 1202 describes a top-level Dial belonging to a Dial group, the process returns to block 1304, indicating that the top-level Dial and its associated lower-level Dials will be processed when the Dial group to which it belongs is processed.

In response to a determination at block 1308 that the parent pointer 1233 is a NULL pointer, data processing system 8 creates an instance pointer 1228 to the DIDS 1202 in the instance array 1226 of the DDDS 1200 to which definition pointer 1231 in definition field 1230 of DIDS 1202 points, as depicted at block 1310. Next, at block 1312, data processing system 8 creates a Dial pointer 1252 to the DDDS 1200 of the top-level Dial within Dial pointer array 1208, if the Dial pointer 1252 is not redundant. In addition, as shown at block 1314, data processing system 8 creates a latch pointer 1254 within latch pointer array 1210 pointing to each latch data structure 1204, if any, referenced by an output pointer 1238 of the DIDS 1202 of the top-level Dial. As shown at block 1316, each branch at each lower level of the Dial tree, if any, headed by the top-level Dial referenced by the selected top-level pointer 1250 is then processed similarly by performing the functions illustrated at block 1310-1316 until a latch data structure 1204 terminating that branch is found and processed. The process then returns to block 1304, representing the processing of each top-level pointer 1250 within top-level pointer array 1206.

In response to a determination at block 1304 that all top-level pointers 1250 have been processed, the process illustrated in FIG. 10 proceeds to block 1320. Block 1320 illustrates the creation of a Dial set field 1239 in each DIDS 1320 in the configuration database. As noted above, Dial set field 1239 is a Boolean-valued field that in initialized to FALSE and is updated to TRUE when the associated Dial instance is explicitly set. In addition, as depicted at block 1322, data processing system 8 creates a latch value field 1246, latch set field 1248, and set history field 1249 in each latch data structure 1204 to respectively indicate the current set value of the associated configuration latch, to indicate whether or not the configuration latch is currently set by an explicit set command, and to indicate whether or not the configuration latch has ever been explicitly set. Although the creation of the four fields indicated at block 1320-1322 is illustrated separately from the processing depicted at blocks 1304-1316 for purposes of clarity, it will be appreciated that it is more efficient to create Dial set field 1239 as each DIDS 1202 is processed and to create fields 1246, 1248 and 1249 as the latch data structures 1204 at the bottom of each Dial tree are reached. The process of loading the configuration database into volatile memory thereafter terminates at block 1324.

Figure 11:
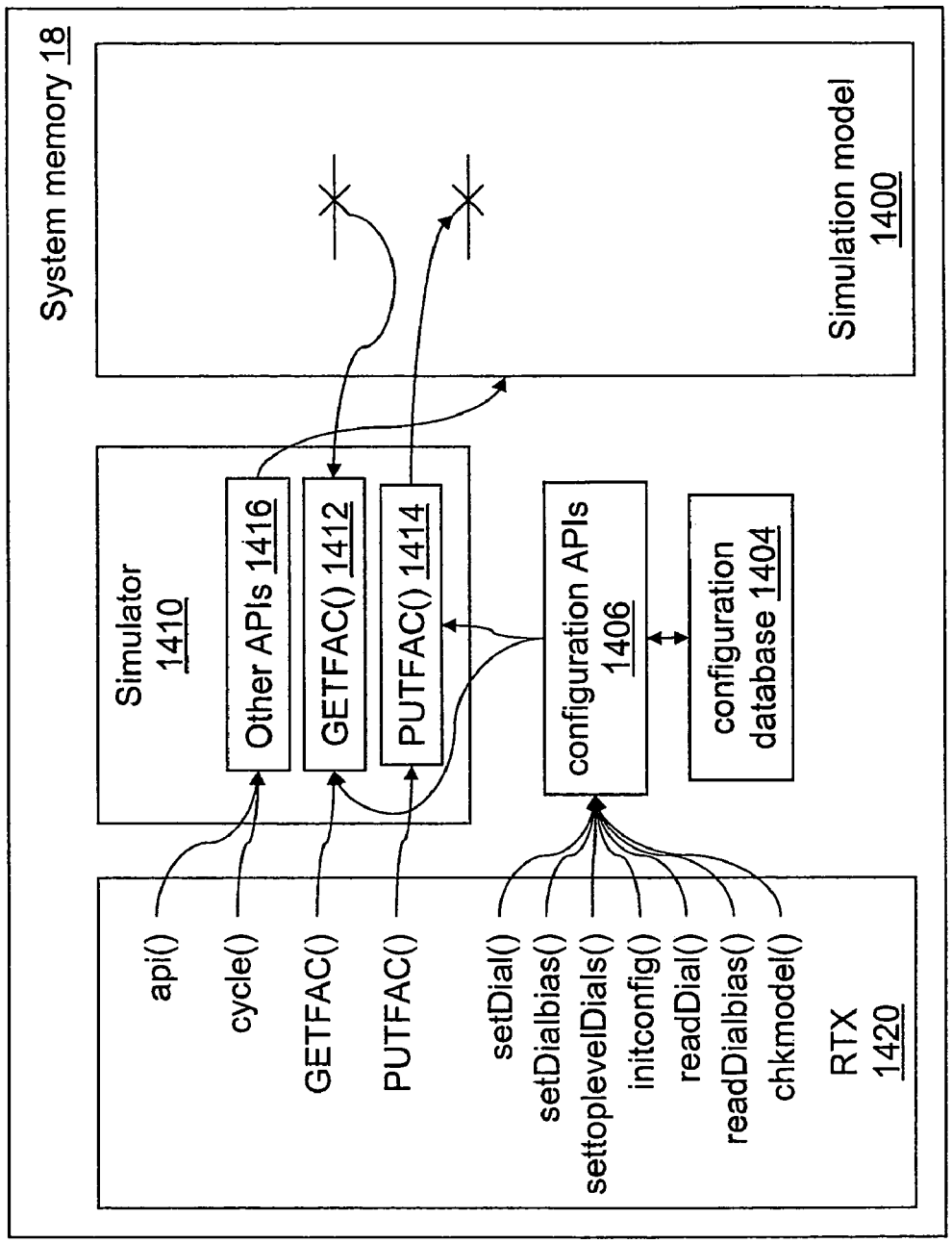
FIG. 11 is a block diagram depicting the contents of volatile system memory during a simulation run of a simulation model in accordance with the present invention.

With the configuration database loaded into volatile memory, a simulation model can be configured and utilized to simulate a digital design through the execution of simulation software. With reference to FIG. 11, there is illustrated a block diagram depicting the contents of system memory 18 (FIG. 1) during a simulation run of a simulation model. As shown, system memory 18 includes a simulation model 1400, which is a logical representation of the digital design to be simulated, as well as software including configuration APIs 1406, a simulator 1410 and an RTX (Run Time eXecutive) 1420.

Simulator 1410 loads simulation models, such as simulation model 1400, into system memory 18. During a simulation run, simulator 1410 resets, clocks and evaluates simulation model 1400 via various APIs 1416. In addition, simulator 1410 reads values in simulation model 1400 utilizing GETFAC API 1412 and writes values to simulation model 1400 utilizing PUTFAC API 1414. Although simulator 1410 is implemented in FIG. 11 entirely in software, it will be appreciated in what follows that the simulator can alternatively be implemented at least partially in hardware.

Configuration APIs 1406 comprise software, typically written in a high level language such as C or C++, that support the configuration of simulation model 1400. These APIs, which are dynamically loaded by simulator 1410 as needed, include a first API that loads configuration model 814 from non-volatile storage and expands it in the manner described above with reference to FIG. 10 to provide a memory image of configuration database 1404. Configuration APIs 1406 further include additional APIs to access and manipulate configuration database 1404, as described in detail below.

RTX 1420 controls simulation of simulation models, such as simulation model 1400. For example, RTX 1420 loads test cases to apply to simulation model 1400. In addition, RTX 1420 delivers a set of API calls to configuration APIs 1406 and the APIs provided by simulator 1410 to initialize, configure, and simulate operation of simulation model 1400. During and after simulation, RTX 1420 also calls configuration APIs 1406 and the APIs provided by simulator 1410 to check for the correctness of simulation model 1400 by accessing various Dials, configuration latches, counters and other entities within simulation model 1400.

RTX 1420 has two modes by which it accesses Dials instantiated within simulation model 1400: interactive mode and batch mode. In interactive mode, RTX 1420 calls a first set of APIs to read from or write to one or more instances of a particular Dial within configuration database 1404. The latch value(s) obtained by reference to configuration database 1404 take immediate effect in simulation model 1400. In batch mode, RTX 1420 calls a different second set of APIs to read or write instantiations of multiple Dials in configuration database 1404 and then make any changes to simulation model 1400 at the same time.

In either interactive or batch mode, RTX 1420 must employ some syntax in its API calls to specify which Dial or Dial group instances within simulation model 1400 are to be accessed. Although a number of different syntaxes can be employed, including conventional regular expressions employing wildcarding, in an illustrative embodiment the syntax utilized to specify Dial or Dial group instances in API calls is similar to the compact expression hereinbefore described. A key difference between the compact expressions discussed above and the syntax utilized to specify Dial or Dial group instances in the RTX API calls is that, in the illustrative embodiment, Dial and Dial group instances are specified in the RTX API calls by reference to the top-level design entity of simulation model 1400 rather than relative to the design entity in which the Dial or Dial group is specified.

In the illustrative embodiment, each RTX API call targeting one or more Dial or Dial group instances in simulation model 1400 specifies the Dial or Dial group instances utilizing two parameters: an instance qualifier and a dialname qualifier. To refer to only a single Dial or Dial group instantiation, the instance qualifier takes the form "a.b.c.d", which is the hierarchical instantiation identifier of the design entity in which the single Dial or Dial group instantiation occurs. To refer to multiple Dial or Dial group instances, the instance qualifier takes the form "a.b.c[X]", which identifies all instantiations of entity X within the scope of entity instance a.b.c. In the degenerate form, the instance qualifier may simply be "[X]", which identifies all instantiations of entity X anywhere within simulation model 1400.

The dialname qualifier preferably takes the form "Entity.dialname", where "Entity" is the design entity in which the Dial or Dial group is instantiated and "dialname" is the name assigned to the Dial or Dial group in its configuration specification statement. If bracketed syntax is employed to specify the instance qualifier, the "Entity" field can be dropped from the dialname qualifier since it will match the bracketed entity name.

Figure 12:
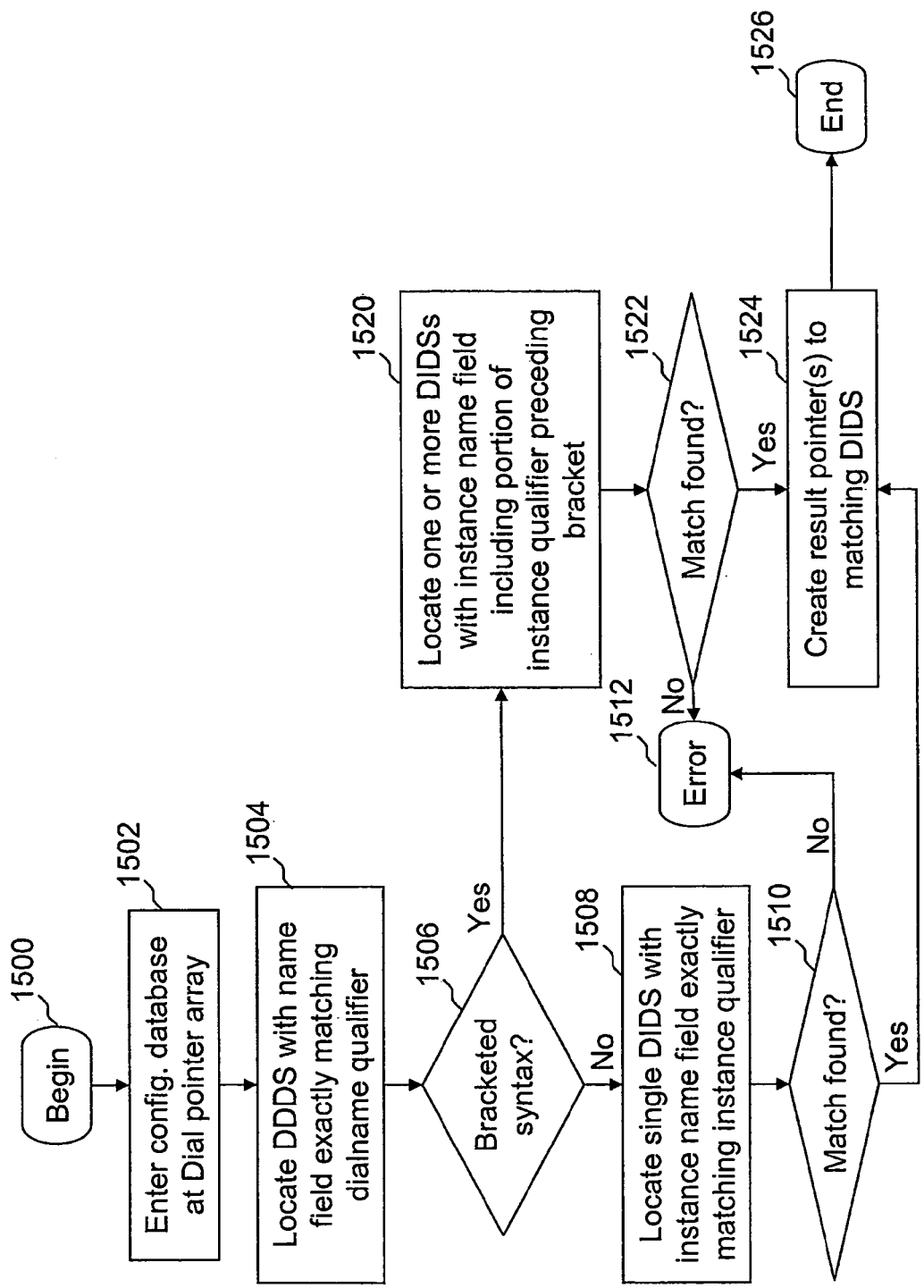
FIG. 12 is a high level logical flowchart of an exemplary method of locating one or more Dial instance data structure (DIDS) in a configuration database that are identified by an instance qualifier and dialname qualifier supplied in an API call.

Referring now to FIG. 12 there is depicted a high level logical flowchart of an exemplary process by which configuration APIs 1406 locate particular Dial or Dial group instances in configuration database 1404 based upon an instance qualifier and dialname qualifier pair in accordance with the present invention. As shown, the process begins at block 1500 in response to receipt by a configuration API 1406 of an API call from RTX 1420 containing an instance qualifier and a dialname qualifier as discussed above. In response to the API call, the configuration API 1406 enters configuration database 1404 at Dial pointer array 1208, as depicted at block 1502, and utilizes Dial pointers 1252 to locate a DDDS 1200 having a name field 1222 that exactly matches the specified dialname qualifier, as illustrated at block 1504.

Next, at block 1506, the configuration API 1406 determines whether the instance qualifier employs bracketed syntax, as described above. If so, the process passes to block 1520, which is described below. However, if the instance qualifier does not employ bracketed syntax, the configuration API 1406 follows the instance pointers 1228 of the matching DDDS 1200 to locate the single DIDS 1202 having an instance name field 1234 that exactly matches the specified instance qualifier. As indicated at blocks 1510-1512, if no match is found, the process terminates with an error. However, if a matching DIDS 1202 is located, a temporary "result" pointer identifying the single matching DIDS 1202 is created at block 1524. The process thereafter terminates at block 1526.

Returning to block 1520, if bracketed syntax is employed, the configuration API 1406 utilizes instance pointers 1228 of the matching DDDS 1200 to locate one or more DIDSs 1202 of Dial or Dial group instances within the scope specified by the prefix portion of the instance identifier preceding the bracketing. That is, a DIDS 1202 is said to "match" if the instance name field 1234 of the DIDS 1202 contains the prefix portion of the instance qualifier. Again, if no match is found, the process passes through block 1522 and terminates with an error at block 1512. However, if one or more DIDSs 1202 "match" the instance qualifier, temporary result pointers identifying the matching DIDSs 1202 are constructed at block 1524. The process shown in FIG. 12 thereafter terminates at block 1526.

Figure 13A:
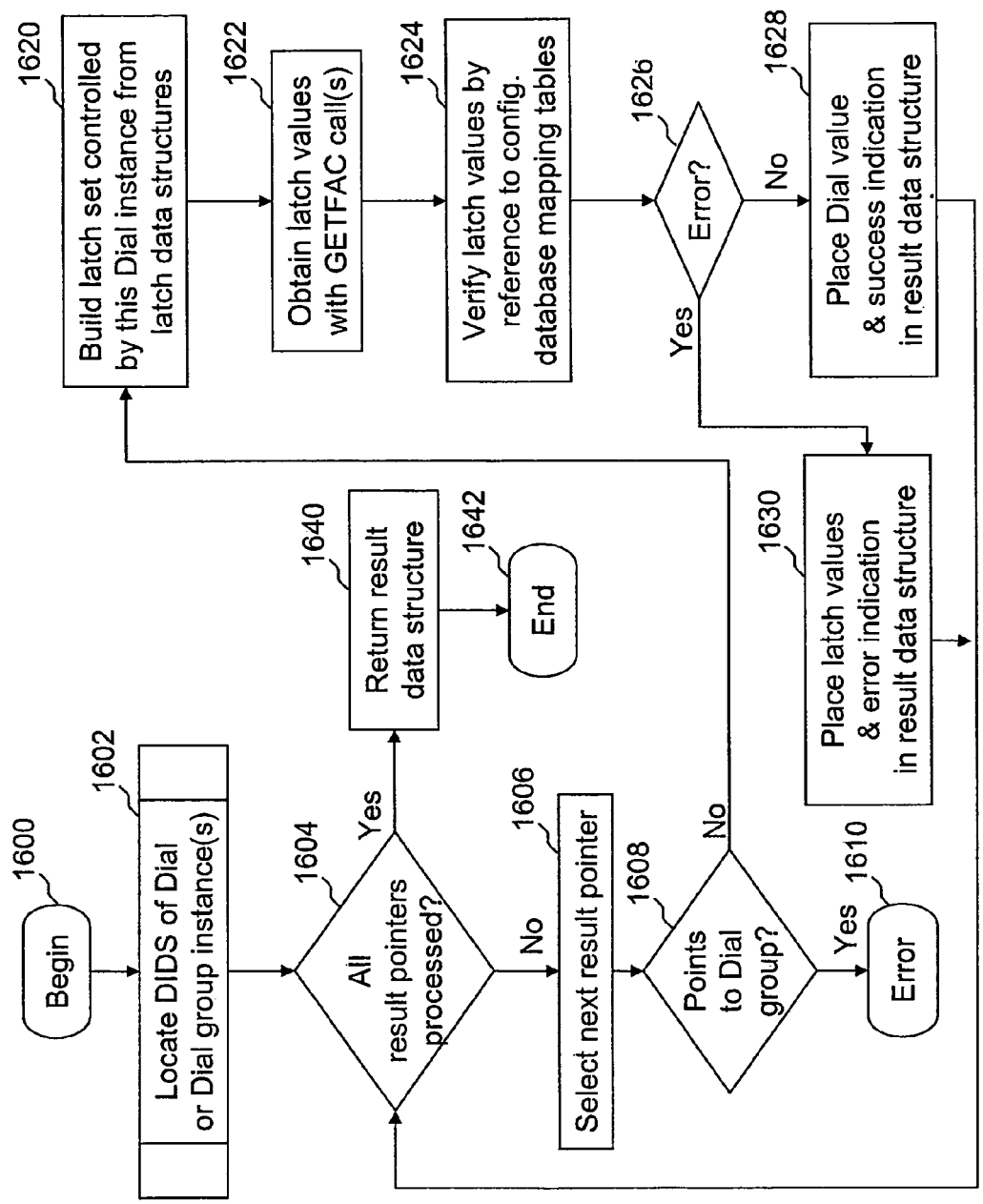
FIG. 13A is a high level logical flowchart of an illustrative method of reading a Dial instance in an interactive mode during simulation of a digital design in accordance with the present invention.

With reference now to FIG. 13A, there is illustrated a high level logical flowchart of an exemplary process by which RTX 1420 reads a value of one or more Dial instances in interactive mode, in accordance with the present invention. As shown, the process begins at block 1600 in response to receipt by a configuration API 1406 of a read_Dial() API call by RTX 1420. As indicated at block 1602, a configuration API 1406 responds to the read_Dial() API call by locating within configuration database 1404 one or more DIDSs 1202 of Dial instances responsive to the API call utilizing the process described above with reference to FIG. 12.

The process then enters a loop at block 1604 in which each of the temporary result pointers generated by the process of FIG. 12 is processed. If all of the result pointers returned by the process of FIG. 12 have been processed, the process passes to block 1640, which is described below. If not, the process proceeds from block 1606 to block 1608, which illustrates the configuration API 1406 selecting a next result pointer to be processed. Next, at block 1608, the configuration API 1406 determines by reference to type field 1220 of the DDDS 1200 associated with the DIDS 1202 identified by the current result pointer whether the DIDS 1202 corresponds to a Dial group. If so, the process illustrated in FIG. 13A terminates with an error condition at block 1610 indicating that RTX 1420 has utilized the wrong API call to read a Dial instance.

In response to a determination at block 1608 that the DIDS 1202 identified by the current result pointer does not correspond to a Dial group instance, the process proceeds to block 1620. Block 1620 depicts configuration API 1406 utilizing output pointers 1238 of the DIDS 1202 (and those of any lower-level DIDS 1202 in the Dial tree) to build a data set containing the latch names from the latch name fields 1244 of latch data structures 1204 corresponding to all configuration latches ultimately controlled by the Dial instance specified in the API call. Next, as depicted at block 1622, the configuration API 1406 makes one or more API calls to GETFAC() API 1412 of simulator 1410 to obtain from simulation model 1400 the latch values of all of the configuration latches listed in the data set constructed at block 1620.

Configuration API 1406 then verifies the latch values obtained from simulation model 1400 by reference to configuration database 1404, as shown at block 1624. In order to verify the latch values, configuration API 1406 utilizes mapping tables 1224 to propagate the latch values up the Dial tree from the corresponding latch data structures through intermediate DIDSs 1202, if any, until an input value for the requested Dial instance is determined. If at any point in this verification process, a Dial instance's output value generated by the verification process does not correspond to one of the legal values enumerated in its mapping table 1224, an error is detected at block 1626. Accordingly, the latch values read from simulation model 1400 and an error indication are placed in a result data structure, as illustrated at block 1630. If no error is detected, the Dial input value generated by the verification process and a success indication are placed in the result data structure, as shown at block 1628.

As indicated by the process returning to block 1604, the above-described process is repeated for each temporary result pointer returned by the process of FIG. 12. Once all result pointers have been processed, the process passes from block 1604 to blocks 1640-1642, which illustrate the configuration API 1406 returning the result data structure to RTX 1420 and then terminating.

RTX 1420 reads Dial instances in interactive mode utilizing the method of FIG. 13A, for example, to initialize checkers that monitor portions of simulation model 1400 during simulation runs. The Dial settings of interest include not only those of top-level Dial instances, but also those of lower-level Dial instances affiliated with the portions of the simulation model 1400 monitored by the checkers.

Reading Dial instances in a batch mode of RTX 1420 is preferably handled by configuration APIs 1406 in the same manner as interactive mode, with one exception. Whereas in interactive mode latch values are always read from simulation model 1440 via calls to GETFAC() API 1412 at block 1622, in batch mode a latch value is preferably obtained from latch value field 1246 of a latch data structure 1204 in configuration database 1404 if latch set field 1248 indicates that the corresponding configuration latch has been set. If the configuration latch has not been set, the latch value is obtained from simulation model 1440 by a call to GETFAC() API 1412. This difference ensures that Dial settings made in batch mode, which may not yet have been reflected in simulation model 1400, are correctly reported.

Figure 13B:
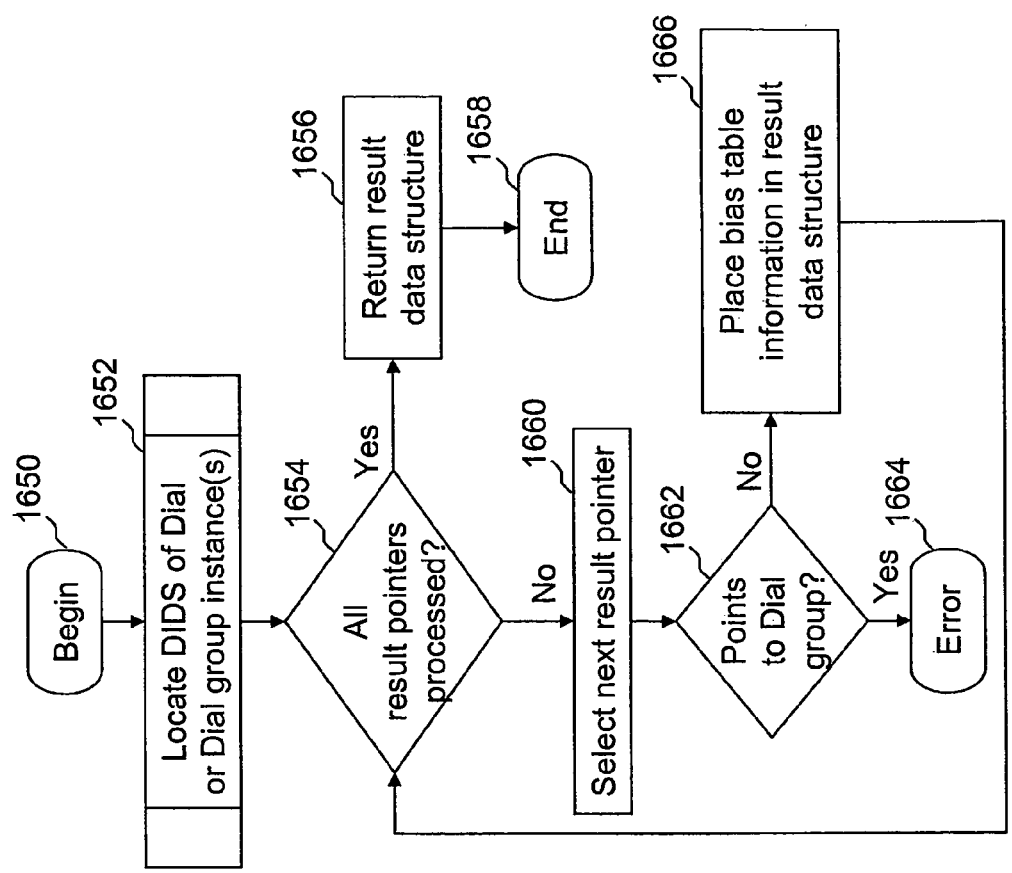
FIG. 13B is a high level logical flowchart of an illustrative method of reading the biasing weight set of Dial instances during simulation of a digital design in accordance with the present invention.

Referring now to FIG. 13B, there is depicted a high level logical flowchart of an exemplary process by which RTX 1420 reads bias information of one or more Dial instances in accordance with the present invention. As shown, the process begins at block 1650 in response to receipt by a configuration API 1406 of a read_Dial_bias() API call by RTX 1420. As indicated at block 1652, a configuration API 1406 responds to the read_Dial_bias() API call by locating within configuration database 1404 one or more DIDSs 1202 of Dial instances responsive to the API call utilizing the process described above with reference to FIG. 12.

The process then enters a loop at block 1654 in which each of the temporary result pointers generated by the process of FIG. 12 is processed. If all of the result pointers returned by the process of FIG. 12 have been processed, the process passes to block 1656, which is described below. If not, the process proceeds from block 1654 to block 1660, which illustrates the configuration API 1406 selecting a next result pointer to be processed. Next, at block 1662, the configuration API 1406 determines by reference to type field 1220 of the DDDS 1200 associated with the DIDS 1202 identified by the current result pointer whether the DIDS 1202 corresponds to a Dial group. If so, the process illustrated in FIG. 13B terminates with an error condition at block 1664.

In response to a determination at block 1662 that the DIDS 1202 identified by the current result pointer does not correspond to a Dial group instance, the process proceeds to block 1666. Block 1666 depicts configuration API 1406 placing in a result data structure the contents of the bias table 1225 of the DDDS 1200 associated with the DIDS 1202 identified by the current result pointer. As described above, the contents of bias table 1225 may include not only a listing of all the sets of the biasing weights defined for the Dial, but also an indication of a currently applied set of biasing weights, if any, for instances of the Dial.

As indicated by the process returning to block 1604, the above-described process is repeated for each temporary result pointer returned by the process of FIG. 12. Once all result pointers have been processed, the process passes from block 1604 to blocks 1640-1642, which illustrate the configuration API 1406 returning the result data structure to RTX 1420 and then terminating.

Figure 14A:
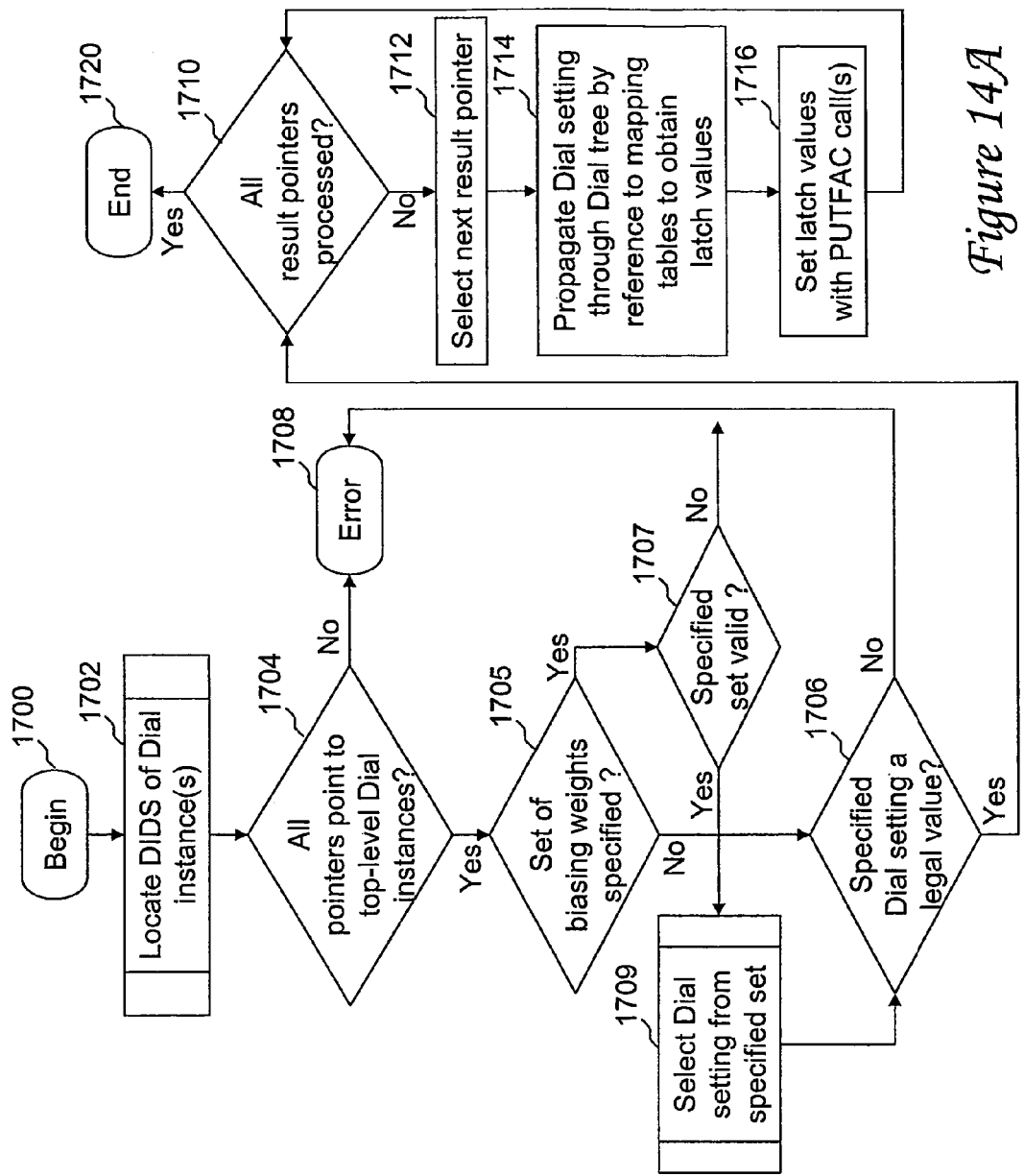
FIG. 14A is a high level logical flowchart of an illustrative method of setting a Dial instance in an interactive mode during simulation of a digital design in accordance with the present invention.

With reference now to FIG. 14A, there is illustrated a high level logical flowchart of an exemplary process by which an RTX sets a Dial instance in an interactive mode in accordance with the present invention. The process begins at block 1700 in response to receipt by a configuration API 1406 of a set_Dial() API call from RTX 1420. In response to the set_Dial() API call, the configuration API 1406 first locates and generates temporary result pointers pointing to the DIDS 1202 of the Dial instance(s) specified in the set_Dial() API call utilizing the technique described above with reference to FIG. 12, as illustrated at block 1702. Next, the configuration API 1406 determines at block 1704 whether or not all of the temporary result pointers point to DIDSs 1202 of top-level Dial instances. This determination can be made, for example, by examining the parent pointer 1233 of each such DIDS 1202 (and that of any higher level DIDS 1202 linked by a parent pointer 1233) and the type fields 1220 of the associated DDDSs 1200. The DIDS 1202 of a top-level Dial instance will have either a NULL parent pointer 1233 or a non-NULL parent pointer 1233 pointing to another DIDS 1202 that the type field 1220 of the associated DDDS 1200 indicates represents a Dial group. If any of the DIDSs 1202 referenced by the result pointers does not correspond to a top-level Dial instance, the process terminates at block 1708 with an error condition.

In response to a determination at block 1704 that all of the DIDSs 1202 referenced by the result pointers correspond to top-level Dial instances, a further determination is made at block 1705 whether or not the set_Dial() API call specified a set of biasing weights, for example, by passing as parameters of the call a flag indicating the use of biasing weights and a string (including a NULL string) identifying a set of biasing weights for the Dial instances. If a determination is made at block 1705 that the set_Dial() API call does not contain a flag indicating that biasing weights are to be applied to set the Dial instances, but instead explicitly enumerates a particular Dial setting, the process proceeds to block 1706, which is described below. If, on the other hand, the set_Dial() API call contains a parameter specifying a set of biasing weights to be applied to the Dial instances, the process proceeds to block 1707. Block 1707 depicts a configuration API 1406 determining whether or not the specified set of biasing weights is valid, that is, whether or not it is enumerated within bias table 1225 of the DDDS 1200 of the Dial instance(s). If not, the process depicted in FIG. 14A terminates with an error at block 1708. If configuration API 1406 determines that the specified set of biasing weights is valid at block 1707, configuration API 1406 selects a Dial setting for the Dial instances from the specified set of biasing weights at block 1709, as described in greater detail below with reference to FIG. 14B. The process then proceeds to block 1706.

Block 1706 depicts configuration API 1406 determining whether or not the specified value to which the Dial instance(s) are to be set is one of the values specified in the mapping table 1224 of the associated DDDS 1200. If not, the process terminates with an error at block 1708. However, in response to a determination at block 1706 that the specified value to which the Dial instance(s) are to be set is one of the legal values (which is always the case if a set of biasing weights is used to set the Dial instances), the process enters a loop including blocks 1710-1716 in which each result pointer is processed to set a respective Dial instance.

At block 1710, configuration API 1406 determines whether or not all result pointers have been processed. If so, the process terminates at block 1720. If, however, additional result pointers remain to be processed, the next result pointer to be processed is selected at block 1712. Next, at block 1714, configuration API 1406 propagates the Dial setting specified in the set_Dial() API call down the Dial tree headed by the top-level Dial instance associated with the DIDS 1202 referenced by the current result pointer. In order to propagate the desired Dial setting, mapping table 1224 in the DDDS 1200 associated with the DIDS 1202 referenced by the current result pointer is first referenced, if necessary, (i.e., for CDials and LDials) to determine the output values for each of output pointers 1238 in the output pointer array 1236 of the DIDS 1202 referenced by the current result pointer. These output values are propagated down the Dial tree as the input values of the next lower-level Dial instances, if any, corresponding to the DIDSs 1202 referenced by output pointers 1238. This propagation continues until a latch value is determined for each configuration latch terminating the Dial tree (which are represented in configuration database 1404 by latch data structures 1204). As shown at block 1716, as each latch value for a configuration latch is determined, the configuration API 1406 makes a call to PUTFAC() API 1414 to set the configuration latch in simulation model 1400 to the determined value utilizing the latch name specified within the latch name field 1244 of the corresponding latch data structure 1204.

Thereafter, the process returns to block 1710, which represents the processing of the top-level Dial corresponding to the next result pointer. After all result pointers are processed, the process terminates at block 1720.

Figure 14B:
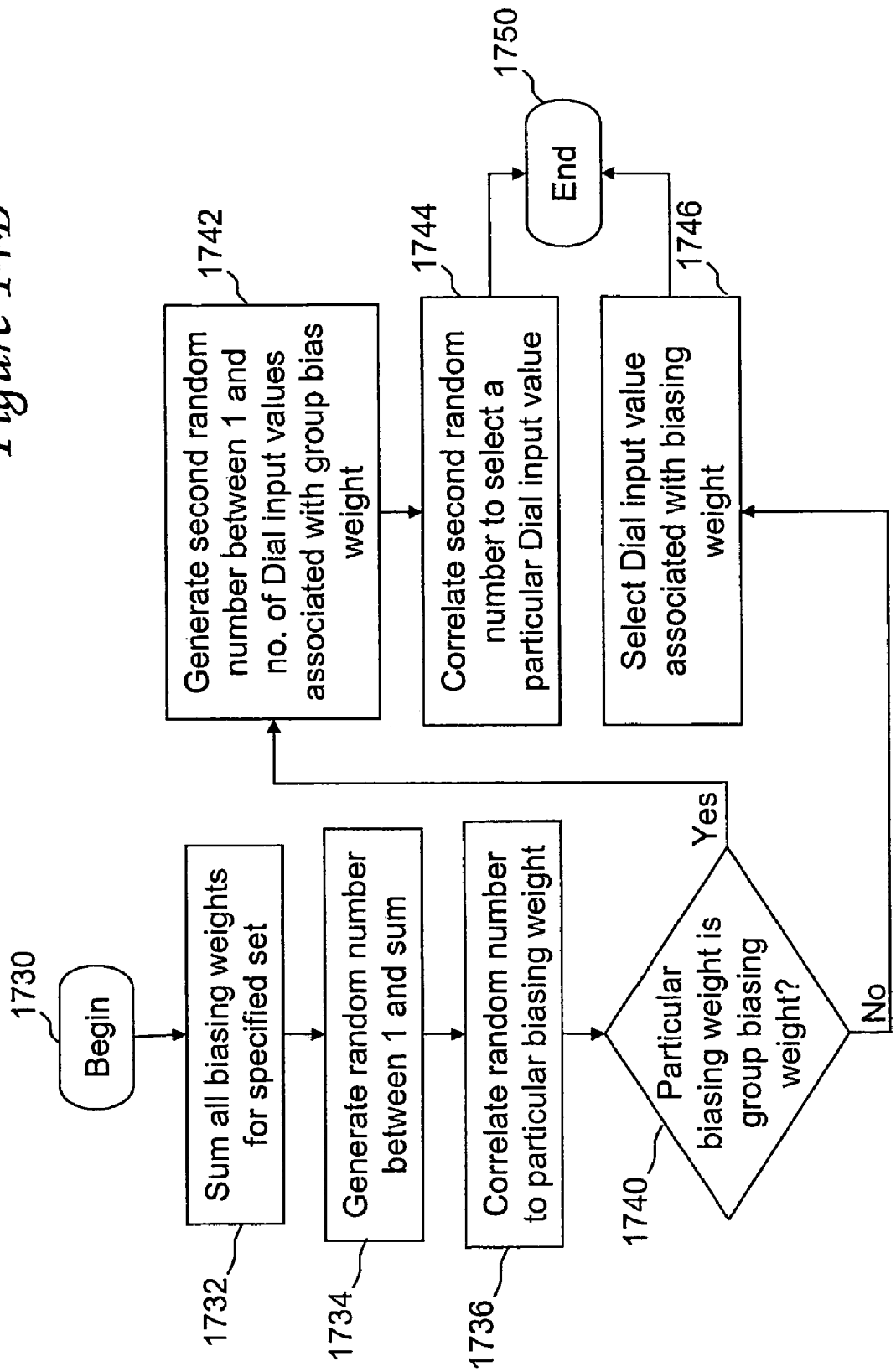
FIG. 14B is a high level logical flowchart of an illustrative method of setting a Dial instance using a set of biasing weights during simulation of a digital design in accordance with the present invention.

With reference now to FIG. 14B, there is illustrated a high level logical flowchart of an exemplary method of selecting a Dial input value (i.e., a Dial setting) by reference to a set of biasing weights in accordance with the present invention. In one embodiment, the illustrated process is performed by a separate routine called by configuration API 1406.

The process begins at block 1730 and then proceeds to blocks 1732 and 1734, which illustrate the routine summing all biasing weights within the specified set of biasing weights and then generating a random number between 1 and the sum. Next at block 1736, the routine correlates the random number generated at block 1734 to a particular biasing weight within the set of biasing weights. For example, for the exemplary "unitsim" set of biasing weights set forth above, which comprises the three biasing weights (2:1, 10), (3:1, 20), and (4:1, 10), the sum of the biasing weights generated at block 1734 is 40. A random number within the range of 1-10 correlates to the first biasing weight, a random number in the range of 11-30 correlates to the second biasing weight, and a random number in the range of 31-40 correlates to the third biasing weight. It will be appreciated that by correlating the random number to the biasing weights in this manner, biasing weights will be selected over time in accordance with the probabilities assigned by the designer.

The routine next determines at block 1740 whether or not the particular biasing weight to which the random number correlates is a group biasing weight associated with multiple Dial input values. If not, the process passes to block 1746, which depicts the routine selecting the Dial input value associated with the biasing weight to which the random number correlates. For example, for the exemplary "unitsim" set of biasing weights, a random number of 15 would correlate to the second biasing weight, which is associated with a Dial input value of 3:1. Following block 1746, the process ends at block 1750.

Referring again to block 1740, in response to a determination that the biasing weight to which the random number correlates is a group biasing weight, the process proceeds to block 1742. Block 1742 depicts the routine generating a second random number between 1 and the number of Dial input values associated with the group bias weight, where each possible value of the random number corresponds to a particular Dial input value. The routine then correlates the second random number to select a Dial input value at block 1744. Thereafter, the process ends at block 1750.

Figure 14C:
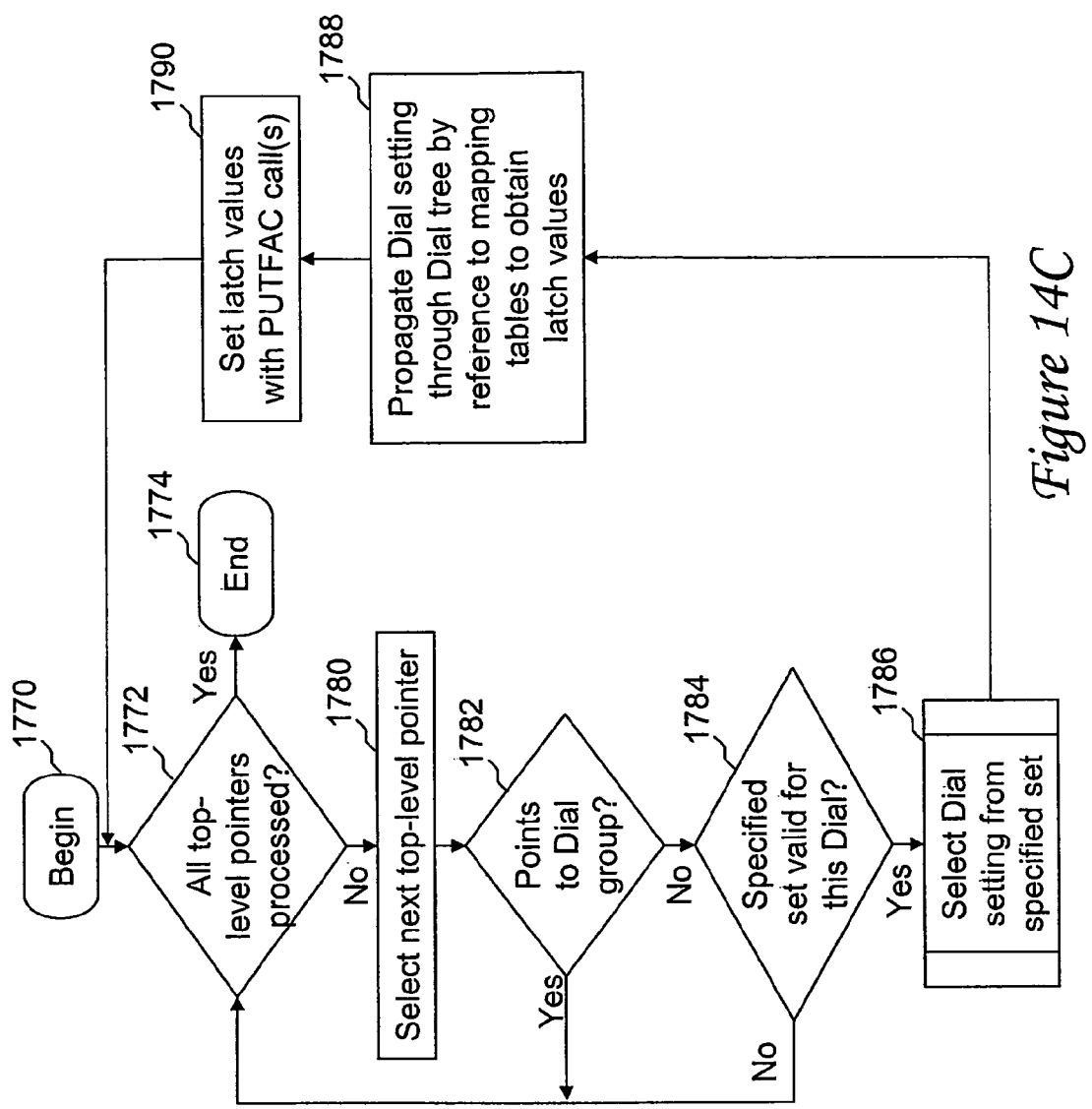
FIG. 14C is a high level logical flowchart of an illustrative method of setting top-level Dial instances during simulation of a digital design in accordance with the present invention.

Referring now to FIG. 14C, there is depicted a high level logical flowchart of an exemplary method by which an RTX sets top-level Dial instance(s) utilizing their biasing weights in accordance with the present invention. The process begins at block 1770 in response to receipt by a configuration API 1406 of a set_top_level_Dials() API call from RTX 1420. In response to the set_top_level_Dials() API call, the configuration API 1406 first locates top-level pointer array 1206. The process then proceeds to block 1772, which illustrates a determination of whether or not all top-level pointers 1250 within top-level pointer array 1206 have been processed. If so, the process terminates at block 1774. If, however, at least one additional top-level pointer remains to be processed, the next top-level pointer 1250 to be processed is selected at block 1780. Next, at block 1782, configuration API 1406 determines by reference to the type field 1220 of the DDDS 1200 identified by the definition pointer 1231 whether or not the instance identified by the top-level pointer 1250 currently under consideration is a Dial group instance. If so, the process returns to block 1772, which has been described. If not, the process proceeds to block 1784.

Block 1784 depicts configuration API 1406 determining whether or not the set of biasing weights specified as a parameter of the API call is valid for the top-level Dial instance under consideration, that is, whether or not it is enumerated within bias table 1225 of the DDDS 1200 of the Dial instance(s). If not, the process depicted in FIG. 14C returns to block 1772, which has been described. If, however, configuration API 1406 determines that the specified set of biasing weights is valid for the current top-level Dial instance at block 1707, configuration API 1406 selects a Dial setting for the top-level Dial instance from the specified set of biasing weights, for example, in accordance with the method of FIG. 14B (block 1786). The process then proceeds to block 1788.

Block 1788 depicts configuration API 1406 propagating the Dial setting selected at block 1786 down the Dial tree headed by the top-level Dial instance associated with the DIDS 1202 referenced by the current top-level pointer 1250. In order to propagate the desired Dial setting, mapping table 1224 in the DDDS 1200 associated with the DIDS 1202 referenced by the current top-level pointer 1250 is first referenced, if necessary, (i.e., for CDials and LDials) to determine the output values for each of output pointers 1238 in the output pointer array 1236 of the DIDS 1202 referenced by the current result pointer. These output values are propagated down the Dial tree as the input values of the next lower-level Dial instances, if any, corresponding to the DIDSs 1202 referenced by output pointers 1238. This propagation continues until a latch value is determined for each configuration latch terminating the Dial tree (which is represented in configuration database 1404 by latch data structures 1204). As shown at block 1790, as each latch value for a configuration latch is determined, the configuration API 1406 makes a call to PUT-FAC() API 1414 to set the configuration latch in simulation model 1400 to the determined value utilizing the latch name specified within the latch name field 1244 of the corresponding latch data structure 1204. Following block 1790, the process returns to block 1772, which has been described.

The process of FIG. 14C thus permits an entire digital system to be efficiently configured according to designer-specified bias weights. For example, to facilitate both simulation testing of a digital design utilizing a simulation model and laboratory testing of a hardware realization of the digital design, the designer may specify, for all relevant Dials, a first set of biasing weights named "sim" and a second set of biasing weights named "lab". In order to configure an entire model for either simulation testing or laboratory testing, an RTX need only specify "sim" or "lab" as a parameter of a set_top_level_Dials() API call, which will cause a configuration API 1406 to set all relevant top-level Dial instances according to the specified set of biasing weights. Of course, any individual Dial instance(s), including Dial instances previously set by a set_top_level_Dials() API call, may further be set in accordance with a set_Dial() API call.

Figure 15A:
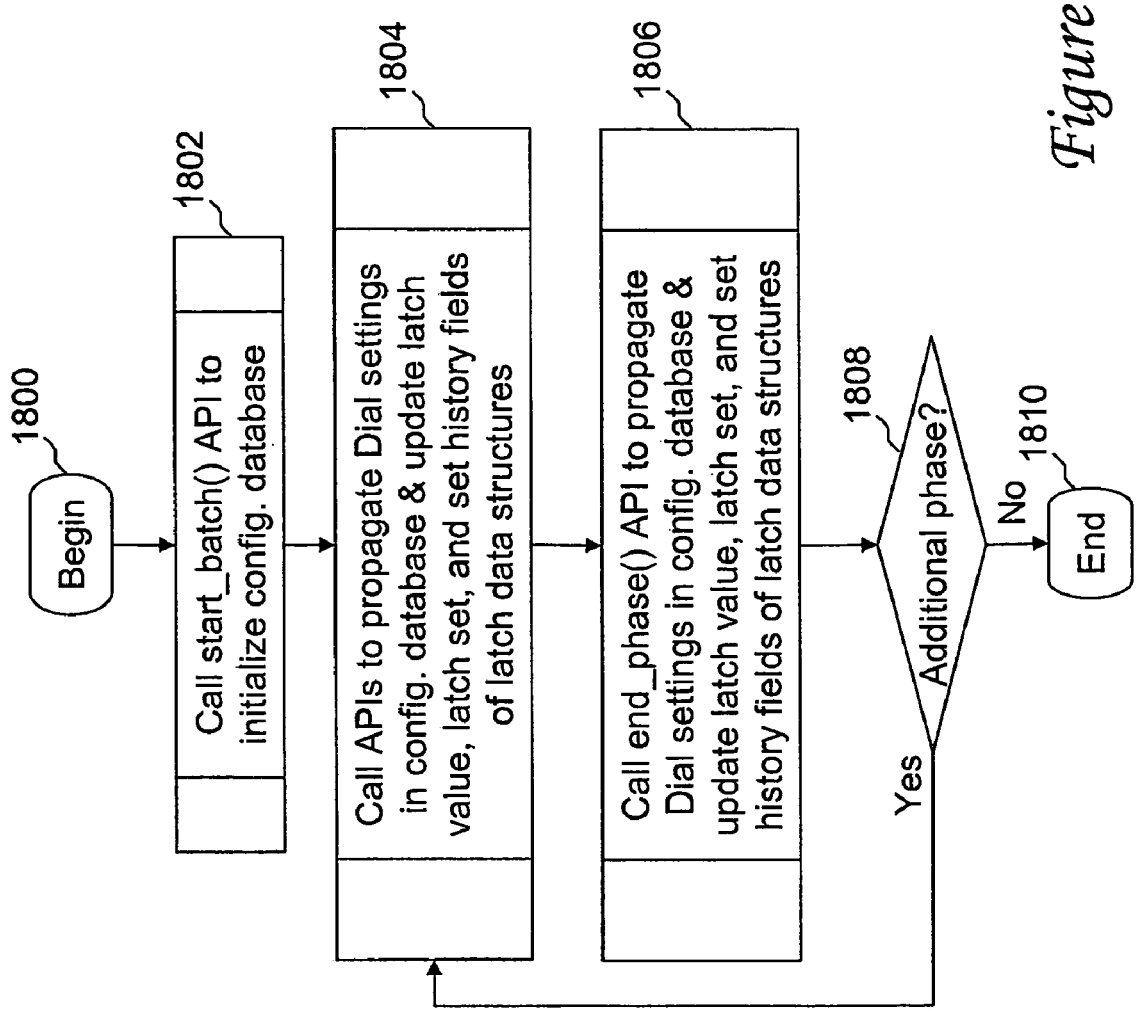
FIG. 15A is a high level logical flowchart of an illustrative method of setting a Dial instance in a batch mode during simulation of a digital design in accordance with the present invention.

With reference now to FIG. 15A, there is illustrated a high level logical flowchart of an exemplary method of setting Dial and Dial group instances in batch mode in accordance with the present invention. As illustrated, the process begins at block 1800 and thereafter proceeds to block 1802, which illustrates RTX 1420 initializing configuration database 1404 by calling a configuration API 1406 (e.g., start_batch()) in order to initialize configuration database 1404. The start_batch() API routine initializes configuration database 1404, for example, by setting each Dial set field 1239 latch set field 1248, and set history field 1249 in configuration database 1404 to FALSE. By resetting all of the "set" fields in configuration database 1404, the Dials and configuration latches that are not set by the current batch mode call sequence can be easily detected, as discussed below.

Following initialization of configuration database 1404 at block 1802, the process shown in FIG. 15A proceeds to block 1804. Block 1804 illustrates RTX 1420 optionally issuing one or more read_Dial()API calls to read one or more Dials as discussed above with respect to FIG. 13A, and optionally issuing one or more batch mode set_Dial() API calls to enter settings for Dial instances and their underlying configuration latches into configuration database 1404. A configuration API 1406 responds to the "set" API calls in the same manner described above with respect to FIG. 14A (for setting Dial instances), with two exceptions. First, when any top-level or lower-level Dial instances are set, whether as a result of a set_Dial() or set_Dial_group() API call, the Dial set field 1239 of the corresponding DIDS 1202 is set to TRUE. Second, no latch values are written to simulation model 1400 by the "set" API routines, as illustrated at blocks 1716 of FIG. 14A. Instead, the latch values are written into latch value fields 1246 of the latch data structure 1204 corresponding to each affected configuration latch, and the latch set field 1248 is updated to TRUE. In this manner, the Dial instances and configuration latches that are explicitly set by the API call can be readily identified during subsequent processing.

Following block 1804, the process passes to block 1806, which illustrates RTX 1420 calling an end_batch() API routine among configuration APIs 1406 to complete the present phase of default application. As indicated at block 1806 and as described in detail below with respect to FIG. 15B, the end_batch() API routine applies selected default values, if any, to specified Dial instances and propagates these default values to underlying configuration latches into configuration database 1404. The latch values of all configuration latches set explicitly or with a default value are then potentially applied to latches within the simulation model. Finally, preparation is made for a next phase, if any.

If RTX 1420 has an additional phase of default application, the process passes from block 1806 to block 1808 and then returns to block 1804, which represents RTX 1420 initiating a next phase of default application. If, however, all phases of default application have been processed, the process illustrated in FIG. 15A passes from block 1806 through block 1808 to block 1810, where the batch process terminates.

Figure 15B:
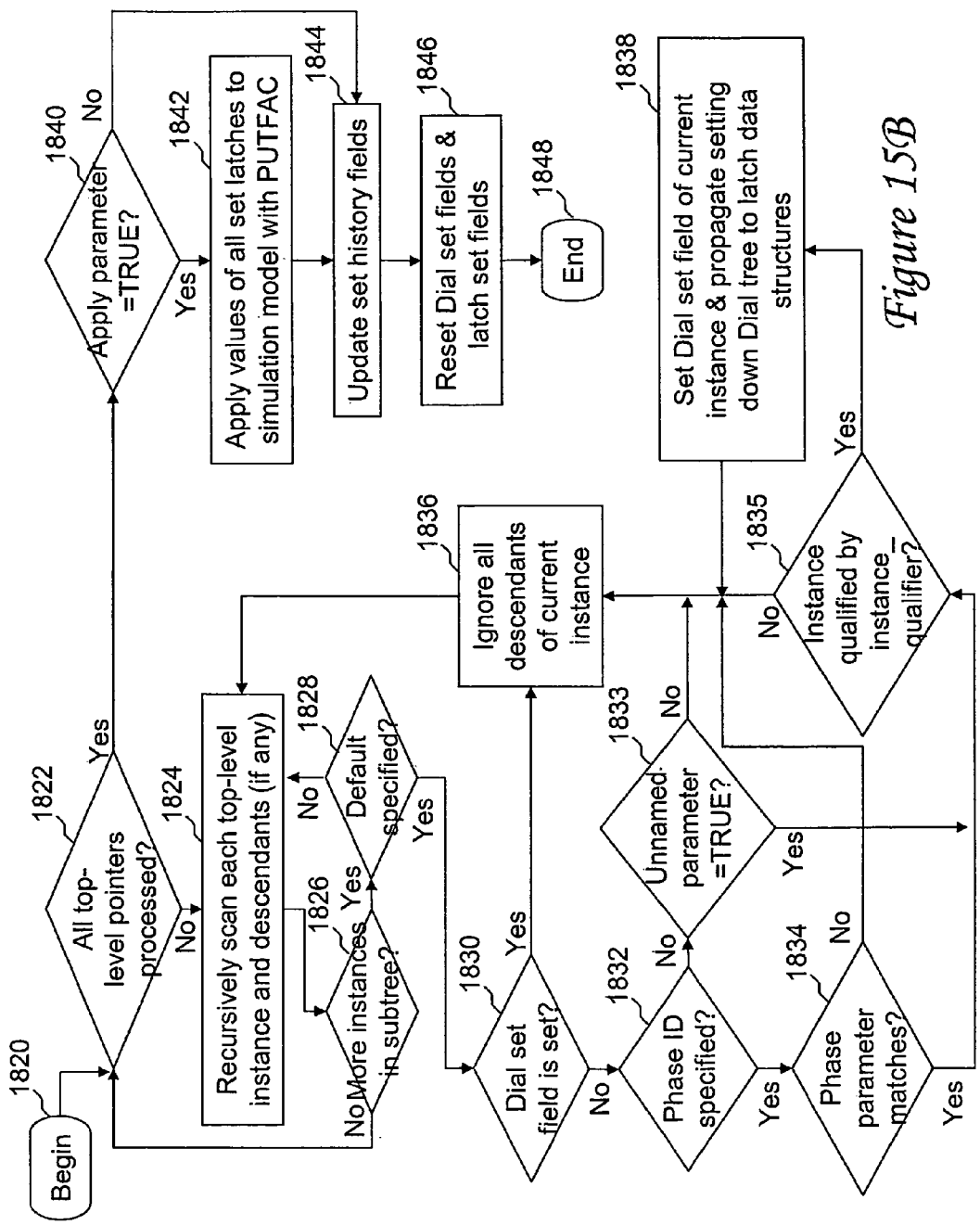
FIG. 15B is a more detailed flowchart of an end_phase API called within the process shown in FIG. 15A.

Referring now to FIG. 15B, there is depicted a high level logical flowchart of an exemplary embodiment of the end_phase() API routine called at block 1806 of FIG. 15A. As shown, the process begins at block 1820 when the end_phase() API routine is called by RTX 1420, for example, with the following statement:

End_phase(phases,unnamed,instance_qualifier,apply)

In this exemplary API call, the "phases" parameter is a string specifying the phase ID(s) of defaults to be applied at the end of the current phase; "unnamed" is a Boolean parameter indicating whether or not defaults values without any associated phase ID should be applied during the current phase; "apply" is a Boolean-valued parameter indicating whether or not configuration latch values should be immediately applied to simulation model 1400; and "instance_qualifier" is one or more regular expressions that can be utilized to limit which instances of a particular Dial are processed to apply defaults.

By specifying an instance_qualifier parameter for the end_phase() API routine, a user can limit the application of defaults to only a portion of simulation model 1400. The ability to restrict the application of defaults in this manner is particularly useful in cases in which two sections of the simulation model 1400 (e.g., sections representing two different integrated circuit chips) have different phasing requirements but use the same phase IDs. Thus, collisions in phase IDs can be resolved by appropriate specification of the instance_qualifier used in conjunction with the phase ID.

The end_phase() API routine then enters a processing loop including blocks 1822-1838 in which DIDSs 1202 within configuration database 1404 are processed to apply appropriate Dial default values, if any. Referring first to block 1822, the end_phase() API determines whether or not all top-level pointers 1250 within top-level pointer array 1206 have been processed. If so, the process proceeds from block 1822 to block 1840, which is described below. If not all top-level pointers 1250 within top-level pointer array 1206 have been processed, the process proceeds to block 1824. Block 1824 represents the end_phase() API routine recursively scanning the DIDSs 1202 pointed to by a next top-level pointer 1250 and its descendant DIDSs 1202, if any, to apply the default values indicated by the parameters of the end_phase() API call. If the end_phase() API routine determines at block 1826 that it has processed all necessary DIDSs 1202 in the subtree of the top-level DIDS 1202 identified by the current top-level pointer 1250, then the process returns to block 1822, which has been described. If, however, at least one DIDS 1202 in the subtree of the top-level DIDS 1202 identified by the current top-level pointer 1250 remains to be processed, the process passes from block 1826 to block 1828.

Block 1828 illustrates the end_phase() API routine examining a next DIDS 1202 to determine whether or not its default field 1229 has a non-NULL value. If the current DIDS 1202 does not contain a non-NULL default field 1229, the process returns to block 1824, representing the end_phase API routine continuing the recursive processing of DIDSs 1202 in the subtree of the top-level DIDS 1202 pointed to by the current top-level pointer 1250. If the default field 1229 contains a non-NULL value, the process passes to block 1830, which depicts a determination of whether or not the Dial set field 1239 is set, that is, whether the Dial instance was previously explicitly set at block 1804 of FIG. 15A. If the Dial set field 1239 is set, the default value contained in default field 1229 is ignored (since the simulation user has already explicitly specified a value for the associated Dial instance). And because simulation database 1400 is constructed so that any descendant of a DIDS 1202 having a specified default cannot have a default value, the process passes to block 1836, which illustrates the end_phase() API routine skipping the processing of any DIDS 1202 in the subtree of the current DIDS 1202. Thereafter, the process returns to block 1824, which has been described.

Returning to block 1830, in response to a determination that the Dial set field 1239 of the current DIDS 1202 is not set, the process proceeds to block 1832. Block 1832 illustrates end_phase() API interrogating phase ID field 1227 of the current DIDS 1202 to determine whether the default value stored in default field 1229 has one or more associated phase IDs. If not, the process passes to block 1833, which is described below. In response to a determination at block 1832 that phase ID field 1227 stores at least one phase ID, the end_phase() API next determines at block 1834 whether the phases parameter of the end_phase() API call specifies a phase ID that matches a phase ID contained within phase ID field 1227. If no match is found, the process passes from block 1834 to block 1836, which has been described. If, on the other hand, a phase ID specified in the phases parameter of the end_phase() API call matches a phase ID contained within the phase ID field 1227 of the current DIDS 1202, the end_phase() API next determines at block 1835 whether or not the Dial instance name contained in instance name field 1234 of the current DIDS 1202 matches the qualifying expression passed as the instance_qualifier parameter of the end_phase() API call. Again, in response to a negative determination at block 1835, the process passes to block 1836, which has been described. If, on the other hand, the Dial instance name contained within instance name field 1234 is qualified by the instance_qualifier parameter, the process proceeds to block 1838, which is described below.

Returning to block 1833, if the current DIDS 1202 does not have one or more phase IDs specified within phase ID field 1227, a further determination is made whether or not the unnamed parameter of the end_phase() API call has a value of TRUE to indicate the default values without any associated phase information should be applied during the current phase. If not, the process passes from block 1833 to block 1836, which has been described. If, on the other hand, the end_phase() API determines at block 1833 that defaults without associated phase information should be applied during the current phase, the process proceeds to block 1835, which has been described above.

Thus, when the end_phase() API reaches block 1838, end_phase() API has, by the determinations illustrated at 1830, 1832, 1833, 1834 and 1835 determined that the default specified for the Dial instance corresponding to the current DIDS 1202 should be applied in the current phase of batch mode execution. Accordingly, at block 1838, the end_phase() API routine applies the default value specified in the default field 1229 to mapping table 1224 to generate one or more Dial output signal(s), which are then propagated down the Dial tree of the current DIDS 1202 in the manner hereinbefore described, ultimately setting the latch value fields 1246 and latch set field 1248 of each of the underlying latch data structures 1204 within configuration database 1404 to values corresponding to the Dial default value. The process then proceeds from block 1838 to block 1836, which has been described.

Returning to block 1822, in response to a determination that the Dial trees of all of the DIDS 1202 pointed to by top-level pointers 1250 have been processed to apply any appropriate default values in the manner described above, the process next passes to block 1840. Block 1840 depicts end_phase() API examining the apply parameter of the end_phase() API call to determine whether or not the configuration latch values within latch data structures 1204 should be applied to simulation model 1400. The added degree of control represented by this determination is advantageous in that different sections of simulation model 1400, which may have colliding phase IDs, can be independently configured within configuration database 1404 in different phases, but the resulting configuration latch values can be applied to simulation model 1400 at the same time, if desired. If the apply parameter has the value FALSE, meaning that the configuration latch values are not to be applied to simulation model 1400 during the current phase, the process passes directly to block 1844.

If, however, configuration latch values are to be applied to simulation model 1400 during the current phase, as indicated by an apply parameter value of TRUE, the end_phase() API routine proceeds to block 1842. At block 1842, the end_phase() API utilizes latch pointer array 1210 to examine each latch data structure 1204 in configuration database 1404. For each latch data structure 1204 in which latch set field 1248 has the value TRUE, the end_batch() API routine issues a call to PUTFAC() API 1414 of simulator 1410 to update simulation model 1400 with the latch value contained in latch value field 1246. In addition, as shown at block 1844, the end_phase() API performs a logical OR operation between the value of latch set field 1248 and set history field 1249, storing the result within set history field 1249. In this manner, each set history field 1249 maintains an indication of whether or not the corresponding configuration latch has been set during any phase of the batch mode process.

Following block 1844, the end_batch API proceeds to block 1846, which depicts the end_batch API routine resetting all of Dial set fields 1239 in DIDS 1202 and all latch set fields 1248 in preparation of a next phase, if any. Thereafter, the end_phase API routine terminates at block 1848.

In summary, the end_phase() API routine applies Dial default values to configuration database 1404 that match the limiting phase and instance_qualifiers and then optionally applies the resulting configuration latch values to simulation model 1400 in accordance with the apply parameter. Finally, the end_phase() API routine tracks which latch data structures 1204 have been set utilizing set history fields 1249, and resets various set fields to prepare for a next phase, if any.

Heretofore, default values have been described solely with respect to designer-supplied phase information specified within HDL files 800 or configuration specification files 802. For many simulation models 1400, designers have only limited knowledge of the boot sequence of the simulation model 1400 and corresponding hardware implementations and therefore have limited understanding of the phasing of defaults required to appropriately initialize the simulation model 1400 or corresponding hardware realization. Accordingly, it is desirable to provide downstream users, such as simulation users, laboratory users or deployment support personnel, with the ability to specify phase information governing the application of Dial default values.

Figure 15C:
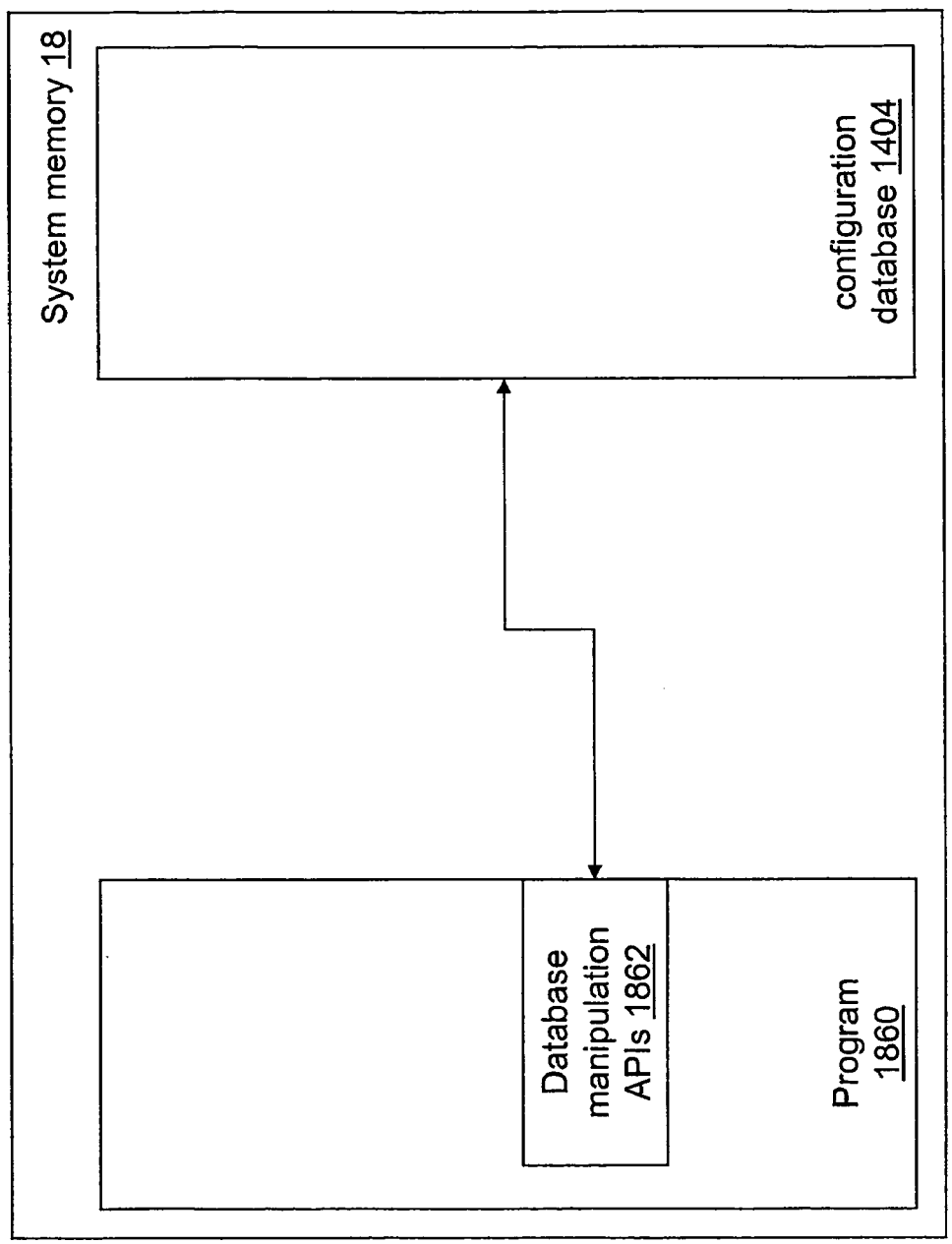
FIG. 15C is a block diagram of a data processing system environment in which a program may be utilized to access and modify a configuration database.

As shown in FIG. 15C, in one embodiment, users are permitted to supply and/or modify the phase ID(s) stored within phase ID fields 1227 of configuration database 1404 or a corresponding hardware configuration database (discussed below) utilizing a program 1860. Program 1860 includes a set of database manipulation API routines 1862 that, when called with appropriate parameters, permits a user to read and write phase IDs within configuration database 1404 (or the corresponding hardware configuration database).

Referring again to FIG. 11, configuration APIs 1406 preferably further include a find_unset_latch() API that, following a batch mode setting of Dial or Dial group instances in configuration database 1404, audits all of the latch data structures 1204 in configuration database 1204 by reference to latch pointer array 1210 in order to detect configuration latches that have not been configured by an explicit or default setting (i.e., those having set history field 1249 set to FALSE). For each such unset configuration latch, the find_unset_latch() API preferably returns the fully qualified instance name of the configuration latch from latch name field 1244 in the corresponding latch data structure 1204 and the fully qualified instantiation identifier of the top-level Dial instance that controls the unset latch. The find_unset_latch() API thus provides an automated mechanism for a user to verify that all Dial and latch instances requiring an explicit or default setting are properly configured for a simulation run.

Configuration APIs 1406 preferably further include a check_model() API that, when called, utilizes top-level pointer array 1206 to verify by reference to the appropriate mapping tables 1224 that each top-level CDial and LDial instance in simulation model 1400 is set to one of its legal values. Any top-level LDial or CDial set to an illegal value is returned by the check_model() API.

The Dial and Dial group primitives introduced by the present invention can be employed not only to configure a simulation model of a digital design as described above, but also to configure hardware realizations of the digital design for laboratory testing and customer use. In accordance with an important aspect of the present invention, hardware realizations of the digital design are configured and the configuration of hardware realizations can be read by reference to a hardware configuration database, which like configuration databases 814 and 1404 discussed above, is derived from configuration specification statements coded by the designers. The reading and setting of configurations in hardware systems can be performed in like manner to the processes previously described with reference to FIGS. 12, 13A-13C, 14A-14C, and 15A-15B. In this manner, continuity in configuration methodology exists from design, through simulation and laboratory testing, to commercial deployment of a digital design.

Figure 16:
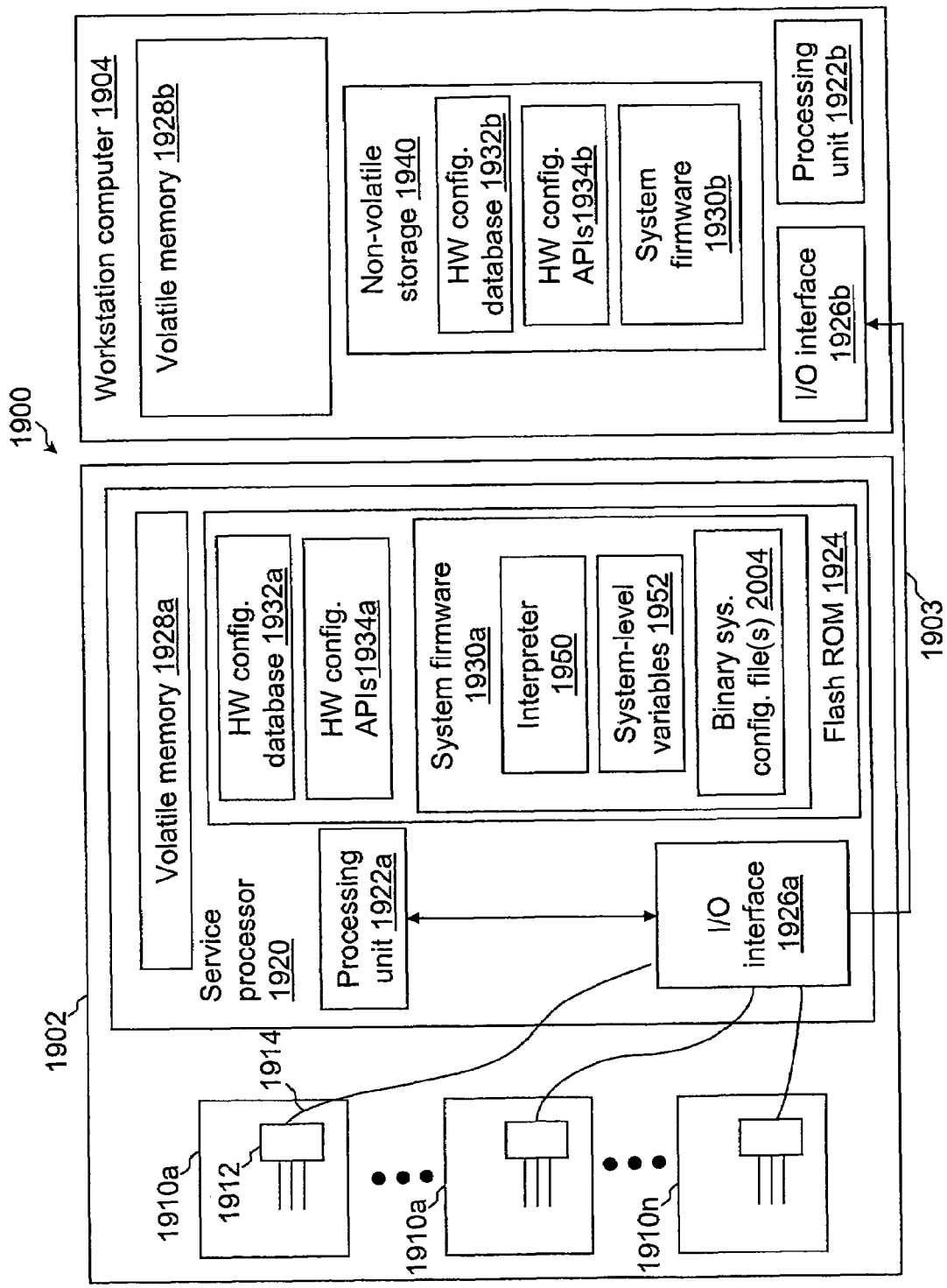
FIG. 16 is a block diagram depicting an exemplary laboratory testing system in accordance with the present invention.

Referring now to FIG. 16, there is illustrated a high-level block diagram of a laboratory testing system for testing and debugging hardware realizations of one or more digital designs in accordance with an embodiment of the present invention. As illustrated, the laboratory testing system 1900 includes a data processing system 1902, which is intended for commercial sale and deployment. For laboratory testing and debugging, data processing system 1902 is coupled by a test interface 1903 to a workstation computer 1904 that communicates with data processing system 1902 via test interface 1903 to configure the various components of data processing system 1902 for proper operation. When commercially deployed, data processing system 1902 includes the illustrated components, but is not typically coupled to workstation computer 1904 by test interface 1903.

Data processing system 1902 may be, for example, a multiprocessor computer system, such as data processing system 6 of FIG. 1. As such, data processing system 1902 includes multiple integrated circuit chips 1910 representing the various processing units, controllers, bridges and other components of a data processing system. As is typical of commercial data processing systems, data processing system 1902 may contain multiple instances of some integrated circuit chips, such as integrated circuit chips 1910a, and single instances of other integrated circuit chips, such as integrated circuit chip 1910n.

In addition to their respective functional logic, integrated circuit chips 1910 each have a respective test port controller 1912 that supports external configuration of the integrated circuit chip utilizing multiple scan chains. To permit such external configuration, each test port controller 1912 is coupled by a test access port (TAP) 1914 to a service processor 1920 within data processing system 1902.

Service processor 1920 is a general-purpose or special-purpose computer system utilized to initialize and configure data processing system 1902, for example, at power-on, in response to a reboot, or during operation. Service processor 1920 includes at least one processing unit 1922a for executing software instructions, a flash read-only memory (ROM) 1924 providing non-volatile storage for software and data, an I/O interface 1926a interfacing service processor 1920 with test port controllers 1912 and workstation computer 1904, and a volatile memory 1928a that buffers instructions and data for access by processing unit 1922a.

Among the software and data stored in flash ROM 1924 is system firmware 1930a. System firmware 1930a is executed by processing unit 1922a of service processor 1920 at power-on to sequence power to integrated circuit chips 1910, perform various initialization procedures and tests, synchronize communication between integrated circuit chips 1910, and initiate operation of the functional clocks. System firmware 1930a controls the startup behavior of integrated circuit chips 1910 by communication via test access ports 1914.

In addition to system firmware 1930a, flash ROM 1924 stores hardware (HW) configuration APIs 1934a and a HW configuration database 1932a describing integrated circuit chips 1910. During commercial deployment, processing unit 1922a calls various HW configuration APIs 1934a to access HW configuration database 1932a in order to appropriately configure integrated circuits 1910 via I/O interface 1926a and TAPs 1914.

Workstation computer 1904, which may be implemented, for example, as a multiprocessor computer system like data processing system 6 of FIG. 1, includes many components that are functionally similar to those of service processor 1920. Accordingly, like reference numerals designate processing unit 1922b, volatile memory 1928b, I/O interface 1926b, and the system firmware 1930b, HW configuration database 1932b, and HW configuration APIs 1934b residing in non-volatile storage 1940 (e.g., disk storage). It will be appreciated by those skilled in the art that, because the system firmware 1930b, HW configuration database 1932b and HW configuration APIs 1934b residing in non-volatile storage 1940 are specifically designed to initialize and configure data processing system 1902 in the context of laboratory testing and debugging, they may have smaller, larger or simply different feature sets and capabilities than the corresponding software and data within flash ROM 1924.

During laboratory testing and debugging, workstation computer 1904 assumes most of the functions of service processor 1920. For example, workstation computer 1904 initializes and configures data processing system 1902 by executing system firmware 1930*b* and various HW configuration APIs 1934*b* in order to generate various I/O commands. These I/O commands are then communicated to data processing system 1902 via test interface 1903 and I/O interfaces 1926*a* and 1926*b*. System firmware 1930*a*, which executes within service processor 1920 in a "bypass mode" in which most of its native functionality is disabled, responds to these external I/O commands by issuing them to integrated circuit chips 1910 via test access ports 1914 in order to initialize and configure integrated circuit chips 1910.

In order to properly initialize a complex digital system, such as data processing system 1902, the configuration of configuration latches within integrated circuit chips 1910 may require reference to the values of system-level variables above the scope of the HDL design entities corresponding to integrated circuit chips 1910. For example, proper configuration of a complex digital system may require knowledge of system content variables having values representing the types, numbers and characteristics of the components present in the system (e.g., the types and number of processing units 1922*a*, the size of volatile memory 1928*a*, etc.). In addition, configuration of a complex digital system may require knowledge of system temporal variables, such as the phases of IPL during which particular system components and/or configuration latches are to be set. The values of at least some of these system variables cannot be known a priori, but must instead be determined at the time of configuration.

To facilitate the automation of the configuration of configuration latches that depend upon system-level variables, the present invention provides a system-level configuration specification language. In one embodiment, the system-level configuration specification language supports system configuration statements of the form:

```
value_type Dial_name [phase] {
    value1, expr1, expr2, ..., exprX;
    value2, expr1, expr2, ..., exprY;
    ...
    valueN, expr1, expr2, ..., exprZ;
}
```

This exemplary expression form includes a preamble including a value type, which designates the variable type of values contained in the body of the expression (e.g., enumerated or integer), a Dial_name, which indicates the Dial name of the Dial that will potentially be set by the statement, and an optional phase parameter, which indicates (e.g., with an expression or a constant) a phase(s) of processing during which the expression should be evaluated. The body of the expression form includes one or more rows delimited by semicolons (;), where each row indicates an input value of the Dial (e.g., value 1) identified by Dial_name followed by zero or more comma delimited expressions (e.g., expr 1), which may include system content variable(s) and/or system temporal variable(s). When evaluated, the system configuration statement sets the Dial identified by Dial_name to the value contained in the first-evaluated row for which all expressions, if present, evaluate as true.

Figure 17:
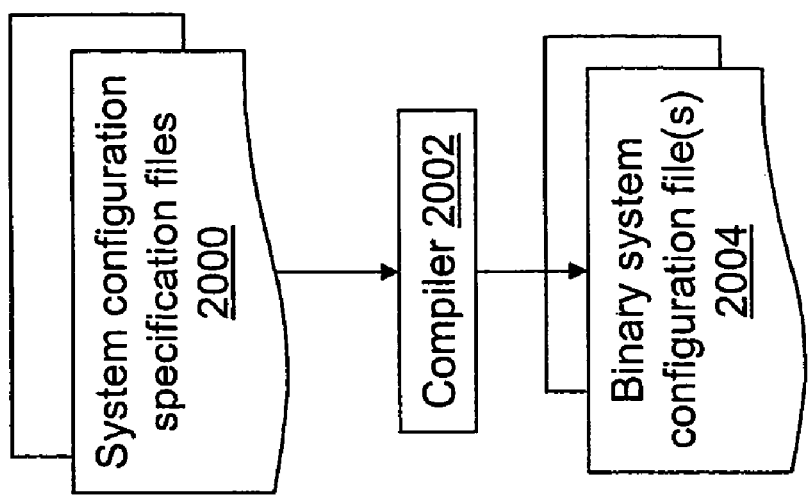
FIG. 17 depicts the compilation of a system-level configuration file in accordance with the present invention.

As shown in FIG. 17, to specify a configuration of one or more digital systems of possibly different configurations, a design team member composes at least one human-readable (e.g., ASCII) system configuration specification file 2000 containing one or more system configuration statements, which may employ the exemplary syntax discussed above. In one embodiment, a configuration specification file 2000 is created for each type of integrated circuit chip 1910. Each system configuration specification file 2000 is then compiled by a compiler 2002 executing on a data processing system (e.g., data processing system 6 of FIG. 1) to obtain one or more compact binary system configuration files 2004. In one embodiment, a binary system configuration file 2004 is created for each type of integrated circuit chip 1910. As illustrated in FIG. 16, each binary system configuration file 2004 is then stored within system firmware 1930*a* and/or 1930*b* together with an interpreter 1950 capable of interpreting or processing binary system configuration file(s) 2004.

Figure 18:
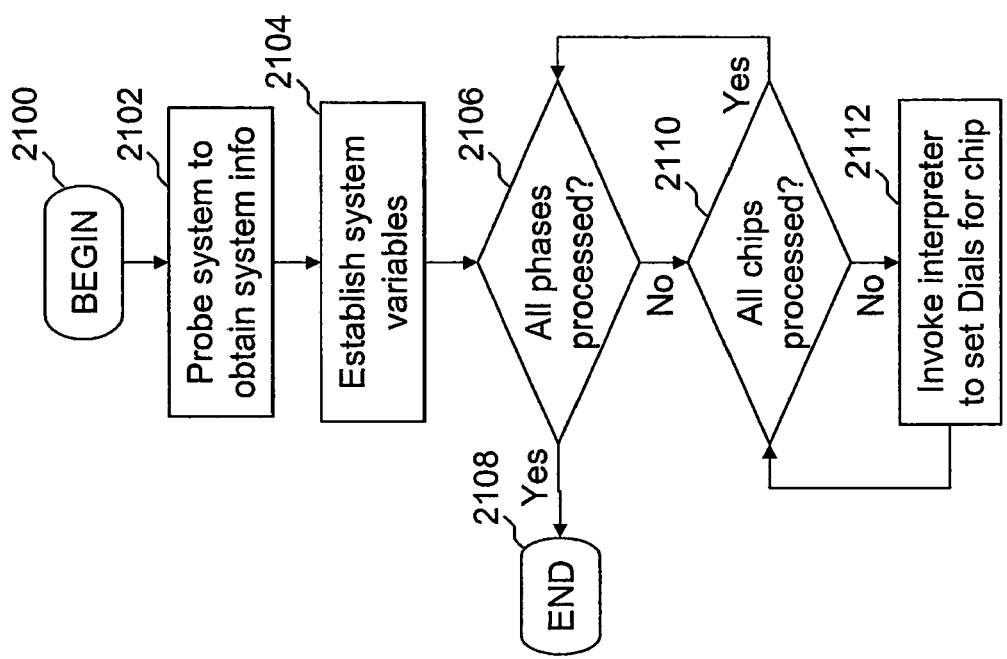
FIG. 18 is a high level logical flowchart of an exemplary method of initializing configuration latches of a digital system based upon system-level variables in accordance with the present invention.

Referring now to FIG. 18, there is depicted a high level logical flowchart of an exemplary process of configuring a digital system based upon system-level variables in accordance with the present invention. The depicted process is performed, for example, through the execution of program code, such as system firmware 1930*a* and/or 1930*b*, by a data processing system 1902 or 1904.

As depicted, the process begins at block 2100 in response to a configuration event, which may be, for example, rebooting or powering on data processing system 1902, adding or removing a component of data processing system 1902, or detection of an error by system firmware 1930. In response to the configuration event, system firmware 1930 probes data processing system 1902 to obtain information regarding data processing system 1902, as shown at block 2102. The information gathered in the system probe preferably includes system variables such as the number, type and operating frequencies of integrated circuits 1910, the topology and frequency of the interconnect fabric utilized to couple integrated circuits 1910, the type of volatile memory 1928*a*, etc. As depicted at block 2104, this system meta-data is stored as system-level variables 1952 within data processing system 1902, for example, within volatile memory 1928*a*.

Following block 2104, system firmware 1930 enters a processing loop including blocks 2106-2112. Block 2106 depicts system firmware 1930 determining whether each of possibly multiple phases of configuration has been performed. If all of the phases of configuration have been performed, system-level configuration by system firmware 1930 ends at block 2106. (Additional configuration of integrated circuit chips 1910 may, of course, be performed by system firmware 1930, as described in the above-referenced U.S. patent application Ser. No. 10/750,112.) If, however, at least one additional phase of system configuration remains to be performed, the process proceeds to block 2110, which illustrates a determination of whether or not all integrated circuit chips 1910 discovered in the system probe have been processed in the current phase of configuration. If so, the process returns to block 2106. If, however, at least one integrated circuit chip 1910 remains to be processed during the current phase of configuration, the process proceeds to block 2112.

Block 2112 depicts system firmware 1930 invoking an interpreter 1950 to interpret the binary system configuration file 2004 for the next integrated circuit chip 1910 with reference to system-level variables 1952. That is, interpreter 1950 processes the binary representations of the system configuration statements contained within the binary system configuration file 2004 using system-level variables 1952 to evaluate the expressions upon which the system-level configuration depends. For each system configuration statement, interpreter 1950 sets the Dial identified by Dial_name to the value contained in the first-evaluated row for which all expressions, if present, evaluate as true. In one preferred embodiment, interpreter 1950 sets the Dials for an integrated circuit chip 1910 by issuing to a HW configuration API 1934*a* a series of API calls specifying Dial names and corresponding Dial input values. In response to the API calls, the HW configuration API 1934*a* accesses HW configuration database 1932*a* to identify the location of the configuration latch(es) within the integrated circuit chip 1910 that correspond to the specified Dial and to determine the settings of the configuration latches that correspond to the Dial input values. The HW configuration API 1934*a* then sets the configuration latches within the integrated circuit chip 1910 to the appropriate settings via I/O interface 1926*a* and the relevant TAP 1914.

Following block 2112, the process returns to block 2110 until the binary configuration file 2004, if any, for each integrated circuit chip 1910 has been processed. Thereafter, the process loops back to block 2106 until all temporal phases of configuration have been processed. The process then terminates at block 2106.

As has been described, the present invention provides an improved method, system and program product for configuring a digital system based upon the values of system-level variables. In accordance with a preferred embodiment, a human-readable system configuration file including a plurality of system configuration statements having predetermined syntax is created and compiled to obtain its binary representation. The binary representation specifies a plurality of diverse configurations that may be alternatively implemented based upon the value of system variables that cannot be known a priori. When a configuration event such as system power-on occurs, the binary representation is processed by an interpreter to set particular Dials in the system to particular values in accordance with the system configuration statements.

While the invention has been particularly shown as described with reference to a preferred embodiment, it will be understood by those skilled in the art that various changes in form and detail may be made therein without departing from the spirit and scope of the invention. For example, it will be appreciated that the concepts disclosed herein may be extended or modified to apply to other types of configuration entities having different rules than the particular exemplary embodiments disclosed herein. In addition, although aspects of the present invention have been described with respect to a computer system executing software that directs the functions of the present invention, it should be understood that present invention may alternatively be implemented as a program product for use with a data processing system. Program code (including software and/or data) defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A method of data processing, said method comprising:
in a database, defining a Dial entity and at least one instance of said Dial entity, wherein each said instance of said Dial entity has an input having a plurality of different possible input values and one or more outputs, wherein each of said plurality of different possible input values has a different associated output value set for said one or more outputs, and wherein each said instance of said Dial entity determines a value of at least one of a plurality of configuration latches in a digital system separate from said database;
in said database, associating with said Dial entity at least one set of biasing weights that, when applied, determines a probability of each instance of said Dial entity having particular ones of said plurality of different possible input values;
in response to a call to set said plurality of configuration latches, accessing said database to apply said at least one set of biasing weights to select one of said plurality of different possible input values for said at least one instance of said Dial entity; and
setting said plurality of configuration latches in said digital system based upon said output value set for said one or more outputs of said at least one instance of said Dial entity.

2. The method of claim 1, wherein:
said associating comprises associating with said Dial entity multiple sets of biasing weights each having an identifier associated therewith; and
said accessing comprises accessing a particular one of said multiple sets of biasing weights having its identifier specified in said call.

3. The method of claim 2, wherein:
said defining comprises defining multiple different Dial entities including said Dial entity;
each of said multiple different Dial entities has multiple sets of biasing weights and all of said multiple different Dial entities has a set of biasing weights sharing a same identifier; and
said accessing comprises accessing said set of biasing weights sharing said same identifier for each of said multiple different Dial entities in order to set instances of said multiple different Dial entities.

4. The method of claim 1, wherein:
said defining comprises defining said Dial entity and said at least on instance of said Dial entity in response to a statement in an HDL file describing said digital system; and
said associating comprises associating with said Dial entity at least one set of biasing weights in response to a statement in an HDL file describing said digital system.

5. The method of claim 1, wherein:
each biasing weight within said at least one set of biasing weights corresponds to a subset of a range of numbers; and
accessing said database to apply said at least one set of biasing weights to select one of said plurality of different possible input values comprises generating a random number in said range of numbers, correlating said random number to a corresponding biasing weight, and selecting one of said plurality of different possible input values for said at least one instance of said Dial entity based upon said corresponding biasing weight.

6. The method of claim 5, wherein:
said correlating comprises correlating said random number to a group biasing weight representing multiple input values of said at least one instance of said Dial entity; and
selecting one of said plurality of different possible input values comprises randomly selecting a single one of said multiple input values represented by said group biasing weight.

* * * * *